United States Patent

Toyotaka

(10) Patent No.: US 9,171,842 B2
(45) Date of Patent: Oct. 27, 2015

(54) SEQUENTIAL CIRCUIT AND SEMICONDUCTOR DEVICE

(71) Applicant: Semiconductor Energy Laboratory Co., Ltd., Atsugi-shi, Kanagawa-ken (JP)

(72) Inventor: Kouhei Toyotaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/947,741

(22) Filed: Jul. 22, 2013

(65) Prior Publication Data

US 2014/0027765 A1    Jan. 30, 2014

(30) Foreign Application Priority Data

Jul. 30, 2012 (JP) .................................. 2012-168450

(51) Int. Cl.
*H01L 29/10* (2006.01)
*H01L 27/088* (2006.01)
*H01L 27/12* (2006.01)

(52) U.S. Cl.
CPC .......... *H01L 27/088* (2013.01); *H01L 27/1225* (2013.01)

(58) Field of Classification Search
CPC .............. H01L 27/088; H01L 27/1225; H01L 29/7869; H01L 21/84; H01L 27/1156; H01L 27/1023; H01L 19/0016
USPC .................... 257/43, E29.296, 200, 369, 401, 257/E27.111, E27.105
See application file for complete search history.

(56) References Cited

U.S. PATENT DOCUMENTS

| 4,430,737 A | 2/1984 | Beranger et al. |
| 5,222,082 A | 6/1993 | Plus |

(Continued)

FOREIGN PATENT DOCUMENTS

| JP | 2001-325798 A | 11/2001 |
| JP | 2005-251335 A | 9/2005 |

(Continued)

OTHER PUBLICATIONS

Lee.Y et al., "16.2: Advanced TFT-LCD Data Line Reduction Method", SID Digest '06 : SID International Symposium Digest of Technical Papers, Jun. 6, 2006, vol. 37, pp. 1083-1086.

*Primary Examiner* — Yosef Gebreyesus
(74) *Attorney, Agent, or Firm* — Eric J. Robinson; Robinson Intellectual Property Law Office, P.C.

(57) ABSTRACT

A highly reliable semiconductor device in which a shift in the threshold voltage of a transistor due to deterioration is prevented is provided. The semiconductor device is formed using a sequential circuit including: a first transistor controlling the electrical connection between a first wiring and a second wiring; a second transistor and a third transistor in each of which a source and a drain are electrically connected to each other and which control the electrical connection between the second wiring and a third wiring; and a switch group controlling the electrical connection between a gate of the first transistor and the third wiring or a fourth wiring, the electrical connection between a gate of the second transistor and the third wiring or the fourth wiring, and the electrical connection between a gate of the third transistor and the third wiring or the fourth wiring in response to a control signal.

19 Claims, 15 Drawing Sheets

(56) References Cited

U.S. PATENT DOCUMENTS

| | | | |
|---|---|---|---|
| 5,410,583 A | 4/1995 | Weisbrod et al. | |
| 5,434,899 A | 7/1995 | Huq et al. | |
| 5,701,136 A | 12/1997 | Huq et al. | |
| 5,859,630 A | 1/1999 | Huq | |
| 5,949,271 A | 9/1999 | Fujikura | |
| 6,064,713 A | 5/2000 | Lebrun et al. | |
| 6,204,789 B1 | 3/2001 | Nagata | |
| 6,300,928 B1 | 10/2001 | Kim | |
| 6,306,694 B1 | 10/2001 | Yamazaki et al. | |
| 6,426,743 B1 | 7/2002 | Yeo et al. | |
| 6,522,323 B1 | 2/2003 | Sasaki et al. | |
| 6,556,646 B1 | 4/2003 | Yeo et al. | |
| 6,690,347 B2 | 2/2004 | Jeon et al. | |
| 6,756,816 B2 | 6/2004 | Miyake | |
| 6,784,711 B2 | 8/2004 | Yu | |
| 6,788,108 B2 | 9/2004 | Miyake et al. | |
| 6,813,332 B2 | 11/2004 | Nagao et al. | |
| 6,928,136 B2 | 8/2005 | Nagao et al. | |
| 6,958,750 B2 | 10/2005 | Azami et al. | |
| 6,975,142 B2 | 12/2005 | Azami et al. | |
| 6,989,805 B2 | 1/2006 | Inukai | |
| 7,057,598 B2 | 6/2006 | Azami et al. | |
| 7,068,076 B2 | 6/2006 | Azami | |
| 7,091,749 B2 | 8/2006 | Miyake et al. | |
| 7,116,748 B2 | 10/2006 | Nagao et al. | |
| 7,151,278 B2 | 12/2006 | Nagao et al. | |
| 7,218,349 B2 | 5/2007 | Kimura | |
| 7,289,593 B2 | 10/2007 | Tobita et al. | |
| 7,333,586 B2 | 2/2008 | Jang | |
| 7,362,139 B2 | 4/2008 | Miyake et al. | |
| 7,394,102 B2 | 7/2008 | Nagao et al. | |
| 7,403,586 B2 | 7/2008 | Tobita et al. | |
| 7,460,099 B2 | 12/2008 | Kubota et al. | |
| 7,511,687 B2 | 3/2009 | Kimura | |
| 7,522,145 B2 | 4/2009 | Lee et al. | |
| 7,529,334 B2 | 5/2009 | Jang | |
| 7,586,478 B2 | 9/2009 | Azami et al. | |
| RE41,215 E | 4/2010 | Miyake et al. | |
| 7,710,384 B2 | 5/2010 | Azami et al. | |
| 7,825,689 B1* | 11/2010 | Vasishta et al. | 326/46 |
| 7,932,888 B2 | 4/2011 | Miyake | |
| 8,264,445 B2 | 9/2012 | Azami et al. | |
| 2003/0128180 A1 | 7/2003 | Kim et al. | |
| 2004/0046729 A1 | 3/2004 | Moon | |
| 2005/0093589 A1* | 5/2005 | Deutschmann et al. | 327/134 |
| 2006/0071923 A1 | 4/2006 | Lee et al. | |
| 2006/0262074 A1 | 11/2006 | Shimoda | |
| 2006/0280279 A1 | 12/2006 | Nagao et al. | |
| 2007/0164971 A1* | 7/2007 | Chang et al. | 345/100 |
| 2007/0217564 A1* | 9/2007 | Tobita | 377/64 |
| 2008/0174589 A1 | 7/2008 | Nagao et al. | |
| 2009/0058463 A1* | 3/2009 | Saint-Laurent et al. | 326/46 |
| 2009/0201011 A1* | 8/2009 | Kajita | 324/113 |
| 2009/0310734 A1* | 12/2009 | Umezaki | 377/64 |
| 2011/0193594 A1* | 8/2011 | Inukai | 326/112 |
| 2011/0193622 A1 | 8/2011 | Miyake | |
| 2012/0032730 A1* | 2/2012 | Koyama | 327/530 |
| 2012/0139601 A1* | 6/2012 | Kim | 327/212 |

FOREIGN PATENT DOCUMENTS

| | | |
|---|---|---|
| JP | 2010-277652 A | 12/2010 |
| JP | 2011-030171 A | 2/2011 |

* cited by examiner ically, in one embodiment of the present invention, the electrical connection between a wiring to which an output signal of the sequential circuit is supplied and a wiring to which the potential of the output signal other than the potential of the pulse is supplied is controlled not by one transistor on the output side but by the plurality of transistors on the output side.

SEQUENTIAL CIRCUIT AND SEMICONDUCTOR DEVICE

BACKGROUND OF THE INVENTION

1. Field of the Invention

The present invention relates to a sequential circuit that includes transistors having the same conductivity type, and a semiconductor device such as a semiconductor display device that includes the sequential circuit.

2. Description of the Related Art

Semiconductor display devices such as liquid crystal display devices and EL display devices preferably include transistors having the same conductivity type rather than CMOS transistors in order to reduce the cost of backplanes (circuit boards). Patent Documents 1 and 2 disclose techniques for forming a variety of circuits such as inverters and shift registers that are used in driver circuits of semiconductor display devices and are constituted of transistors having the same conductivity type.

In particular, for a semiconductor display device including oxide semiconductor transistors, a glass substrate of the fifth generation (1000 mm wide×1200 mm long, or 1100 mm wide×1300 mm long) or later can be used. Thus, such a semiconductor display device has advantages of high productivity and low cost. The oxide semiconductor transistors generally have the same conductivity type. Thus, in the case where the oxide semiconductor is used for a semiconductor display device, a driver circuit of the semiconductor display device includes transistors having the same conductivity type. Accordingly, the oxide semiconductor transistors are suitable for transistors included in a semiconductor display device.

REFERENCE

Patent Documents

[Patent Document 1] Japanese Published Patent Application No. 2001-325798
[Patent Document 2] Japanese Published Patent Application No. 2010-277652

SUMMARY OF THE INVENTION

In a sequential circuit outputting a pulse signal in a driver circuit of a semiconductor display device formed using transistors having the same conductivity type, a deterioration in electric characteristics of the transistors such as a shift in threshold voltage occurs.

Against such a technical background, it is an object of the present invention to provide a highly reliable semiconductor device in which a shift in the threshold voltage of a transistor due to deterioration can be prevented.

A signal output from the sequential circuit (hereinafter referred to as an output signal of the sequential circuit) is used for selecting a plurality of pixels arranged in a pixel portion, and thus the ratio of a pulse width to a pulse period, that is, the duty ratio of the output signal is much lower than that of a clock signal or the like. Further, the transistors provided on the output side of the sequential circuit include a transistor which is continuously on in a period other than a period during which a pulse is output. Since such a transistor is on for longer time than other transistors included in the sequential circuit, a deterioration in electric characteristics such as a shift in threshold voltage occurs in the transistor remarkably.

In view of this, in one embodiment of the present invention, a plurality of transistors each of which can be on or off in a period other than a period during which a pulse is output is provided on the output side of a sequential circuit. Specifi- In the above structure, one of the plurality of transistors on the output side is turned on, whereby the wiring to which the output signal of the sequential circuit is supplied and the wiring to which the potential of the output signal other than the potential of the pulse is supplied can be electrically connected to each other. Therefore, when at least one of the plurality of transistors is on in the period other than the period during which the pulse is output, the wiring can be supplied with the potential of the output signal other than the potential of the pulse; thus, unlike in a conventional structure, one transistor on the output side does not need to be continuously on in the period other than the period during which the pulse is output.

According to one embodiment of the present invention, a highly reliable semiconductor device in which a shift in the threshold voltage of a transistor due to deterioration is prevented can be provided.

DETAILED DESCRIPTION OF THE INVENTION

Figure 1:
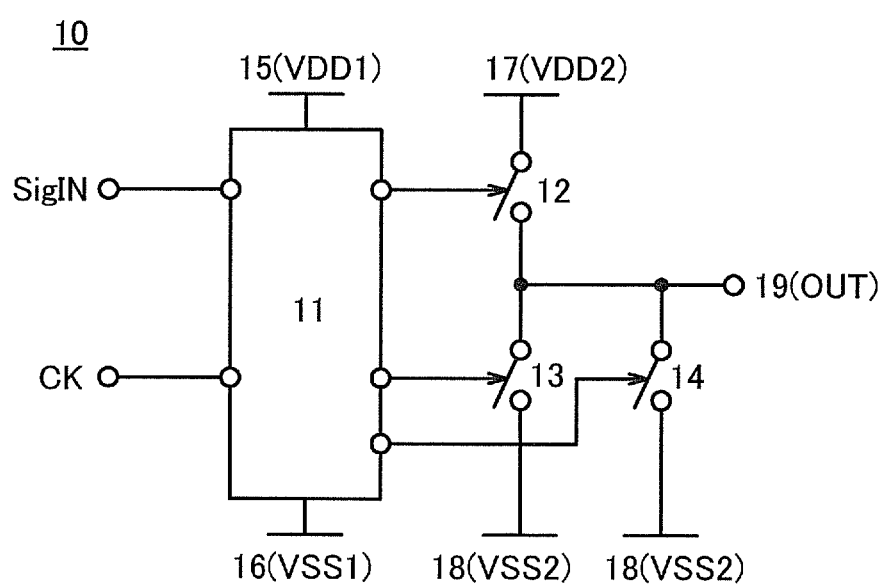
FIG. 1 illustrates the configuration of a sequential circuit.

Hereinafter, embodiments of the present invention will be described in detail with reference to the accompanying drawings. Note that the present invention is not limited to the following description, and it is easily understood by those skilled in the art that the mode and details can be variously changed without departing from the spirit and scope of the present invention. Accordingly, the present invention should not be construed as being limited to the description of the embodiments below.

Note that the present invention includes, in its category, any semiconductor device including transistors, for example, integrated circuits, RF tags, and semiconductor display devices. The integrated circuit includes, in its category, large scale integrated circuits (LSIs) including a microprocessor, an image processing circuit, a digital signal processor (DSP), a microcontroller, and the like and programmable logic devices (PLDs) such as a field programmable gate array (FPGA) and a complex PLD (CPLD). The semiconductor display devices include, in its category, semiconductor display devices in which a circuit element including a semiconductor film is included in a driver circuit, such as liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and the like.

In this specification, the semiconductor display device includes, in its category, panels in which a display element such as a liquid crystal element or a light-emitting element is provided for each pixel, and modules in which an IC or the like including a controller is mounted on the panel.

Note that "connection" in this specification means electrical connection and corresponds to the state in which current, voltage, or potential can be supplied or transmitted. Therefore, a connection state means not only a state of a direct connection but also a state of indirect connection through a circuit element such as a wiring, a resistor, a diode, or a transistor in which current, voltage, or potential can be supplied or transmitted. In addition, even when different components are connected to each other in a circuit diagram, there is actually a case where one conductive film has functions of a plurality of components such as a case where part of a wiring serves as an electrode. In this specification, "connection" also means such a case where one conductive film has functions of a plurality of components.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, for convenience, a connection relation of the transistor is sometimes described assuming that the source and the drain are fixed; actually, the names of the source and the drain interchange with each other depending on the relation of the potentials.

Embodiment 1

FIG. 1 illustrates an example of the configuration of a sequential circuit 10 in one embodiment of the present invention. The sequential circuit 10 illustrated in FIG. 1 includes a circuit 11 including a plurality of switches, a switch 12, a switch 13, and a switch 14.

For each of the switch 12, the switch 13, and the switch 14, a transistor is used. Note that the number of transistors used for each of the switch 12, the switch 13, and the switch 14 may be one, or may be two or more.

To the circuit 11, a wiring 15 to which a high-level potential VDD1 is supplied and a wiring 16 to which a low-level potential VSS1 is supplied are electrically connected. Further, to the circuit 11, a signal SigIN and a clock signal CK which are control signals are supplied. The on/off state of each of the switches in the circuit 11 is selected in response to the signal SigIN and the clock signal CK. The switches each control the electrical connection between a gate of the transistor used for the switch 12, the switch 13, or the switch 14 and one of the wiring 15 and the wiring 16.

The switch 12 has a function of controlling the electrical connection between a wiring 17 to which a high-level potential VDD2 is supplied and a wiring 19 to which an output signal OUT is supplied. The switch 13 has a function of controlling the electrical connection between a wiring 18 to which a low-level potential VSS2 is supplied and the wiring 19. The switch 14 has a function of controlling the electrical connection between the wiring 18 to which the low-level potential VSS2 is supplied and the wiring 19.

Although the switch 13 and the switch 14 each have a function of controlling the electrical connection between the wiring 18 and the wiring 19 in FIG. 1, one of the switch 13 and the switch 14 may have a function of controlling the electrical connection between the wiring 19 and a wiring which is different from the wiring 18 and to which a potential lower than the high-level potentials VDD1 and VDD2 is supplied.

Note that the potential VDD1 and the potential VDD2 may be at the same level. In the case where the potential VDD1 and the potential VDD2 are at the same level, the wiring 15 and the wiring 17 may be electrically connected to each other. Further, the potential VSS1 and the potential VSS2 may be at the same level. In the case where the potential VSS1 and the potential VSS2 are at the same level, the wiring 16 and the wiring 18 may be electrically connected to each other.

In the case where the output signal OUT is supplied from the sequential circuit 10 to a wiring called a bus line connected to a plurality of pixels, such as a scan line, the transistors used for the switches 12, 13, and 14 which are provided on the output side of the sequential circuit 10 need to have high current supply capability. For that reason, the channel width W of the transistor is preferably wider than the channel width W of a transistor used for the switch in the circuit 11.

Next, examples of an operation of the sequential circuit 10 illustrated in FIG. 1 will be described with reference to FIGS. 2A to 2C. Note that FIGS. 2A to 2C illustrate the case where an n-channel transistor 12$t$, an n-channel transistor 13$t$, and an n-channel transistor 14$t$ are used for the switch 12, the switch 13, and the switch 14 respectively in the sequential circuit 10.

Figure 2A:
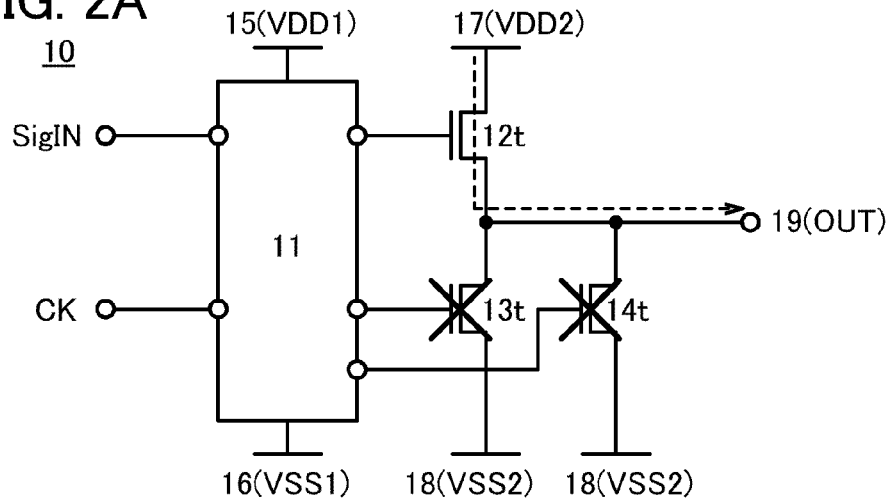
FIGS. 2A to 2C illustrate the operations of the sequential circuit.

As illustrated in FIG. 2A, the electrical connection between each of gates of the transistor 12$t$, the transistor 13$t$, and the transistor 14$t$ and the wiring 15 or the wiring 16 is controlled with the signal SigIN and the clock signal CK, whereby the transistor 12$t$ is turned on, and the transistor 13$t$ and the transistor 14$t$ are turned off. With the above operation, the potential VDD2 of the wiring 17 is supplied as the potential of the output signal OUT to the wiring 19 through the transistor 12$t$.

Figure 2B:
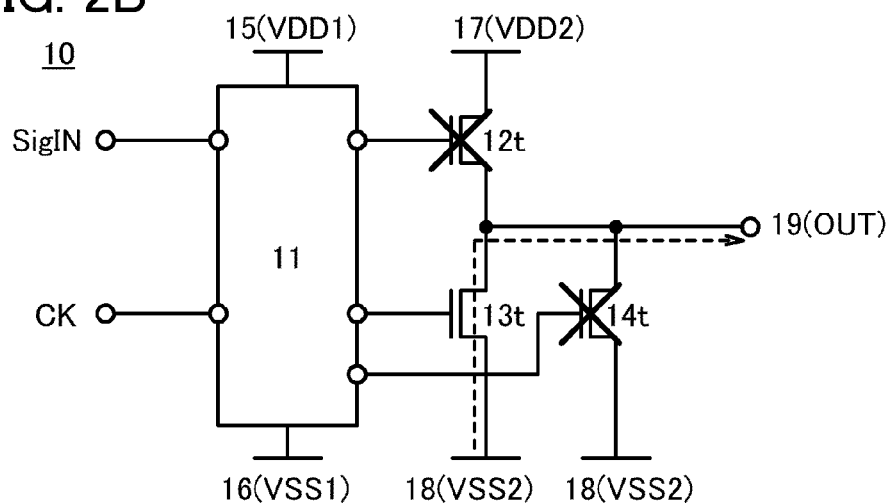

Further, as illustrated in FIG. 2B, the electrical connection between each of the gates of the transistor 12$t$, the transistor 13$t$, and the transistor 14$t$ and the wiring 15 or the wiring 16 is controlled with the signal SigIN and the clock signal CK, whereby the transistor 13$t$ is turned on, and the transistor 12$t$ and the transistor 14$t$ are turned off. With the above operation, the potential VSS2 of the wiring 18 is supplied as the potential of the output signal OUT to the wiring 19 through the transistor 13$t$.

Figure 2C:
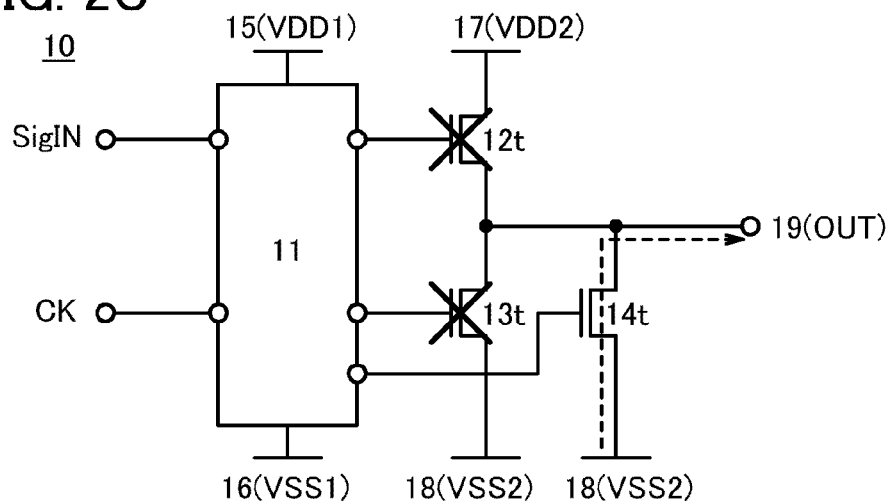

Furthermore, as illustrated in FIG. 2C, the electrical connection between each of the gates of the transistor 12$t$, the transistor 13t, and the transistor 14t and the wiring 15 or the wiring 16 is controlled with the signal SigIN and the clock signal CK, whereby the transistor 14t is turned on, and the transistor 12t and the transistor 13t are turned off. With the above operation, the potential VSS2 of the wiring 18 is supplied as the potential of the output signal OUT to the wiring 19 through the transistor 14t.

As illustrated in FIGS. 2A to 2C, the electrical connection between the wiring 19 to which the output signal OUT of the sequential circuit 10 is supplied and the wiring 18 is controlled by the transistor 13t and the transistor 14t. Therefore, in one embodiment of the present invention, one of the transistor 13t and the transistor 14t is turned on as illustrated in FIGS. 2B and 2C in a period during which the wiring 19 is supplied with the potential VSS2 as the output signal OUT, that is, in a period other than a period during which a pulse is output; thus, the wiring 19 and the wiring 18 can be electrically connected to each other, and accordingly the potential VSS2 can be supplied to the wiring 19. For such a reason, in one embodiment of the present invention, one transistor on the output side does not need to be continuously on in the period other than the period during which the pulse is output unlike in a conventional technique; thus, a deterioration in electric characteristics of the transistor on the output side, such as a shift in threshold voltage, can be prevented, and the reliability of not only the sequential circuit 10 but also the semiconductor device using the sequential circuit 10 can be improved.

The transistor 13t and the transistor 14t each have a function of keeping the potential of the output signal OUT in the period other than the period during which the pulse is output; in addition, the transistor 13t has a function of controlling the falling of the potential of the output signal OUT. Therefore, unlike the transistor 13t, the transistor 14t is not required to have high current supply capability; thus, the channel width of the transistor 14t can be made narrower than that of the transistor 13t. Thus, although one embodiment of the present invention employs a structure in which the electrical connection between the wiring 19 to which the output signal OUT of the sequential circuit 10 is supplied and the wiring 18 to which the potential of the output signal OUT other than the potential of the pulse is supplied is controlled not by one transistor on the output side but by a plurality of transistors such as the transistors 13t and 14t, an increase in the area of the sequential circuit 10 can be prevented.

In the example illustrated in FIG. 1, the electrical connection between the wiring 18 and the wiring 19 is controlled by the switch 13 and the switch 14; however, in the sequential circuit 10 in one embodiment of the present invention, the electrical connection between the wiring 18 and the wiring 19 may be controlled by three or more switches.

Next, a specific example of the configuration of the sequential circuit 10 illustrated in FIG. 1 will be described with reference to FIG. 3. Note that FIG. 3 illustrates the case where the n-channel transistor 12t, the n-channel transistor 13t, and the n-channel transistor 14t are used for the switch 12, the switch 13, and the switch 14 respectively.

Figure 3:
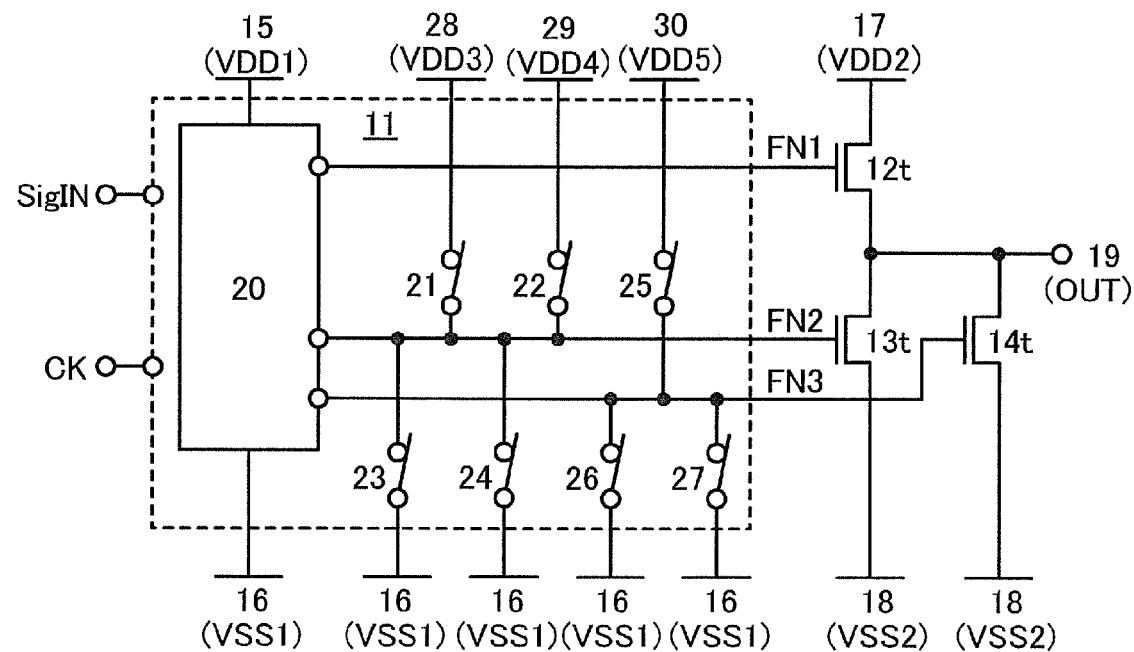
FIG. 3 illustrates the configuration of the sequential circuit.

In the sequential circuit 10 illustrated in FIG. 3, the circuit 11 includes switches 21 to 27 and a circuit 20 having a function of controlling the operation of the transistor 12t.

The circuit 20 includes a plurality of switches. The on/off state of each of the plurality of switches is selected in response to the signal SigIN and the clock signal CK, whereby the electrical connection between the gate of the transistor 12t (illustrated as a node FN1) and one of the wiring 15 and the wiring 16 is controlled by the circuit 20.

The switch 21 has a function of controlling the electrical connection between a wiring 28 to which a high-level potential VDD3 is supplied and the gate of the transistor 13t (illustrated as a node FN2). The switch 22 has a function of controlling the electrical connection between a wiring 29 to which a high-level potential VDD4 is supplied and the gate of the transistor 13t. The switch 23 has a function of controlling the electrical connection between the wiring 16 to which the low-level potential VSS1 is supplied and the gate of the transistor 13t. The switch 24 has a function of controlling the electrical connection between the wiring 16 to which the low-level potential VSS1 is supplied and the gate of the transistor 13t.

The switch 25 has a function of controlling the electrical connection between a wiring 30 to which a high-level potential VDD5 is supplied and the gate of the transistor 14t (illustrated as a node FN3). The switch 26 has a function of controlling the electrical connection between the wiring 16 to which the low-level potential VSS1 is supplied and the gate of the transistor 14t. The switch 27 has a function of controlling the electrical connection between the wiring 16 to which the low-level potential VSS1 is supplied and the gate of the transistor 14t.

The potentials VDD3 to VDD5 may be at the same level as the potential VDD1 or the potential VDD2. In the case where at least one of the potentials VDD3 to VDD5 is at the same level as the potential VDD1 or the potential VDD2, the wirings supplying the potentials at the same level may be electrically connected to each other.

In FIG. 3, the switch 23 and the switch 24 each have a function of controlling the electrical connection between the gate of the transistor 13t and the wiring 16 to which the potential VSS1 is supplied; however, the switch 23 and/or the switch 24 may have a function of controlling the electrical connection between the gate of the transistor 13t and a wiring that is different from the wiring 16 and is supplied with a potential lower than the high-level potentials VDD1 to VDD5.

In the sequential circuit 10 illustrated in FIG. 3, the switch 21 or the switch 22 is turned on in response to the signal SigIN or the clock signal CK, whereby the node FN2 is supplied with the high-level potential VDD3 or VDD4. In this case, since the transistor 13t is on, the wiring 19 is supplied with the potential VSS2 of the wiring 18 as the potential of the output signal OUT.

In the sequential circuit 10 illustrated in FIG. 3, the switch 23 or the switch 24 is turned on in response to the signal SigIN or the clock signal CK, whereby the node FN2 is supplied with the low-level potential VSS1. In this case, since the transistor 13t is off, the wiring 19 is not supplied with the potential VSS2 of the wiring 18 as the potential of the output signal OUT.

In the case where the electrical connection between the gate of the transistor 13t and the wiring 16 to which the low-level potential VSS1 for turning off the transistor 13t is supplied is controlled by a plurality of switches such as the switch 23 and the switch 24 as in the above structure, the operations of the switch 23 and the switch 24 are simple as compared to the case where the electrical connection is controlled by one switch. For that reason, the number of control signals such as the signal SigIN and the clock signal CK for controlling the operation of the sequential circuit 10 can be made small. Thus, although one embodiment of the present invention employs a structure in which the electrical connection between the wiring 19 and the wiring 18 to which the potential of the output signal OUT other than the potential of the pulse is supplied is controlled not by one transistor but by a plurality of transistors such as the transistor 13*t* and the transistor 14*t*, an increase in the number of control signals required for the operation of the sequential circuit 10 can be prevented.

In the sequential circuit 10 illustrated in FIG. 3, the switch 25 is turned on in response to the signal SigIN or the clock signal CK, whereby the node FN3 is supplied with the high-level potential VDD5. In this case, since the transistor 14*t* is on, the wiring 19 is supplied with the potential VSS2 of the wiring 18 as the potential of the output signal OUT.

Further, in the sequential circuit 10 illustrated in FIG. 3, the switch 27 is turned on in response to the signal SigIN or the clock signal CK, whereby the node FN3 is supplied with the low-level potential VSS1. In this case, since the transistor 14*t* is off, the wiring 19 is not supplied with the potential VSS2 of the wiring 18 as the potential of the output signal OUT. Further, since the switch 26 is turned on, the node FN3 is kept supplied with the low-level potential VSS1.

In the case where the electrical connection between the gate of the transistor 14*t* and the wiring 16 to which the low-level potential VSS1 for turning off the transistor 14*t* is supplied is controlled by a plurality of switches such as the switch 26 and the switch 27 as in the above structure, the operations of the switch 26 and the switch 27 are simple as compared to the case where the electrical connection is controlled by one switch. For that reason, the number of control signals such as the signal SigIN and the clock signal CK for controlling the operation of the sequential circuit 10 can be made small. Thus, although one embodiment of the present invention employs a structure in which the electrical connection between the wiring 19 and the wiring 18 to which the potential of the output signal OUT other than the potential of the pulse is supplied is controlled not by one transistor but by a plurality of transistors such as the transistor 13*t* and the transistor 14*t*, an increase in the number of control signals required for the operation of the sequential circuit 10 can be prevented.

In one embodiment of the present invention, the channel width of a transistor used for the switch 27 having a function of bringing the transistor 14*t* into the off state from the on state is wider than the channel width of a transistor used for the switch 26 having a function of keeping the transistor 14*t* on the output side in the off state.

Since the channel width of the transistor used for the switch 27 having a function of bringing the transistor 14*t* into the off state from the on state is wider than the channel width of the transistor used for the switch 26, the time required for bringing the transistor 14*t* into the off state from the on state can be shortened. Thus, the time required for the rising of the pulse of the output signal OUT in the sequential circuit 10 can be shortened.

The switch 26 having a function of keeping the transistor 14*t* in the off state is not required to have high current supply capability. Therefore, by making the channel width of the transistor used for the switch 26 narrow, an increase in the area of the sequential circuit 10 can be prevented even in the case where the electrical connection between the gate of the transistor 14*t* and the wiring 16 to which the potential VSS1 for turning off the transistor 14*t* is supplied is controlled by a plurality of switches such as the switch 26 and the switch 27.

Next, a specific example of the configuration of the sequential circuit 10 illustrated in FIG. 3 will be described with reference to FIG. 4. Note that in the example illustrated in FIG. 4, all transistors used for the switches are n-channel transistors.

Figure 4:
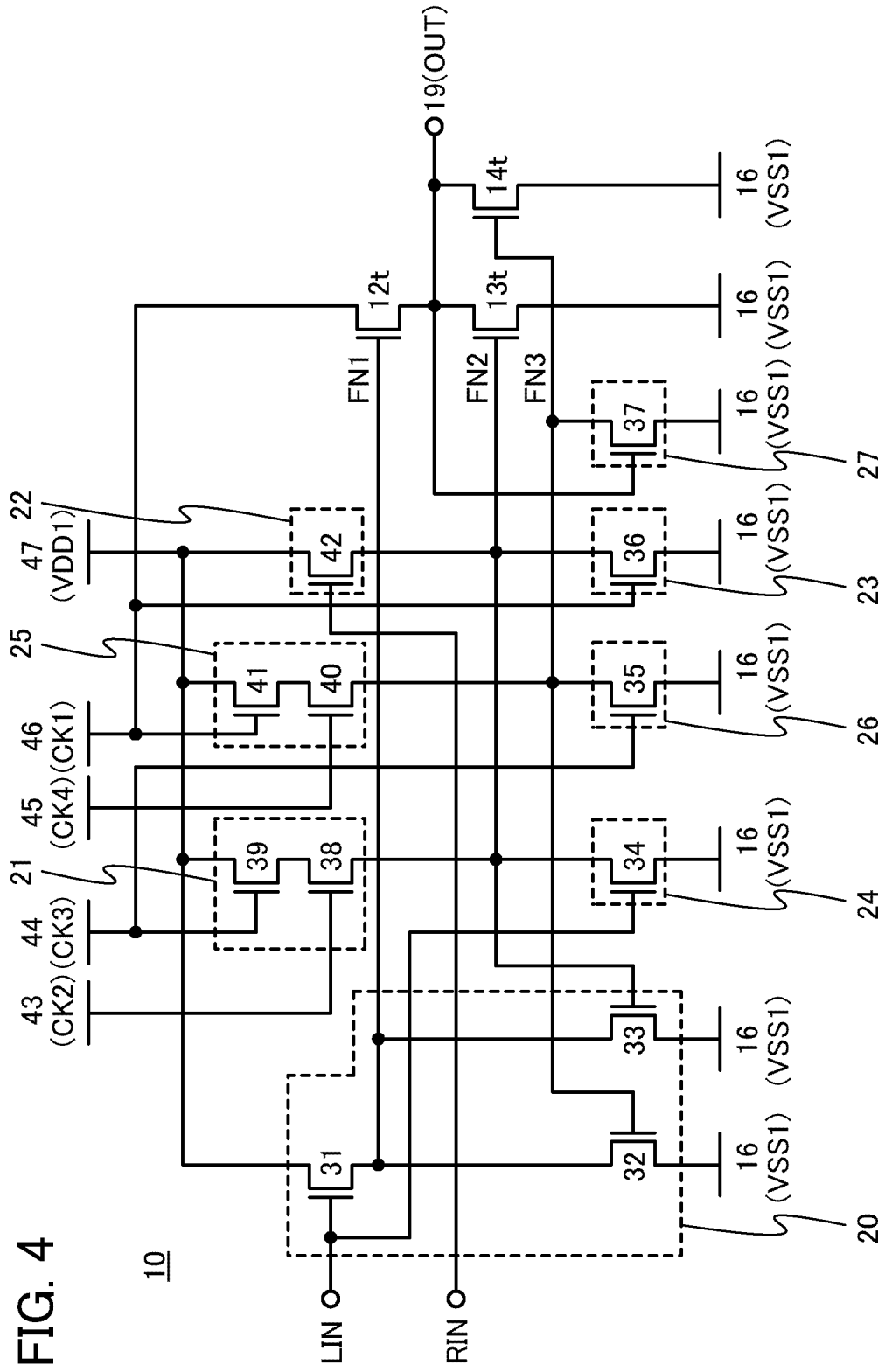
FIG. 4 illustrates the configuration of the sequential circuit.

In the sequential circuit 10 illustrated in FIG. 4, the circuit 20 includes transistors 31 to 33. The switch 21 includes transistors 38 and 39. The switch 22 includes a transistor 42. The switch 23 includes a transistor 36. The switch 24 includes a transistor 34. The switch 25 includes transistors 40 and 41. The switch 26 includes a transistor 35. The switch 27 includes a transistor 37.

Further, the sequential circuit 10 includes the n-channel transistor 12*t* serving as the switch 12, the n-channel transistor 13*t* serving as the switch 13, and the n-channel transistor 14*t* serving as the switch 14.

The sequential circuit 10 illustrated in FIG. 4 is supplied with a signal LIN and a signal RIN corresponding to the signal SigIN and clock signals CK1 to CK4 corresponding to the clock signal CK.

As described above, unlike the transistor 13*t*, the transistor 14*t* is not required to have high current supply capability in one embodiment of the present invention. Therefore, the capacitance formed between the gate and a semiconductor film in the transistor 14*t*, i.e., the gate capacitance in the transistor 14*t* is lower than that in the transistor 13*t*. For this reason, the channel width of each of the transistors used for the plurality of switches for controlling the on/off state can be made narrow. Specifically, in the case of FIG. 4, the channel widths of the transistors 40, 41, 35, and 37 used for the switches 25 to 27 can be made narrower than the channel widths of the transistors 38, 39, 42, 36, and 34 used for the switches 21 to 24.

Therefore, although one embodiment of the present invention employs a structure in which the electrical connection between the wiring 19 to which the output signal OUT of the sequential circuit 10 is supplied and the wiring (the wiring 16 in FIG. 4) to which the potential of the output signal OUT other than the potential of the pulse is supplied is controlled not by one transistor on the output side but by a plurality of transistors on the output side such as the transistors 13*t* and 14*t*, an increase in the area of the sequential circuit 10 can be prevented because the channel width of the transistor 14*t* can be made narrow and the channel widths of the transistors used for the switches 25 to 27 can be made narrow.

Specifically, the transistor 31 has a function of controlling the electrical connection between a wiring 47 to which the potential VDD1 is supplied and the node FN1 in response to the signal LIN. The transistor 32 has a function of controlling the electrical connection between the wiring 16 to which the potential VSS1 is supplied and the node FN1 in response to the potential of the node FN3. The transistor 33 has a function of controlling the electrical connection between the wiring 16 and the node FN1 in response to the potential of the node FN2.

The transistor 34 has a function of controlling the electrical connection between the wiring 16 and the node FN2 in response to the signal LIN. The transistor 35 has a function of controlling the electrical connection between the wiring 16 and the node FN3 in response to the clock signal CK3 supplied to a wiring 44. The transistor 36 has a function of controlling the electrical connection between the wiring 16 and the node FN2 in response to the clock signal CK1 supplied to a wiring 46. The transistor 37 has a function of controlling the electrical connection between the wiring 16 and the node FN3 in response to the output signal OUT supplied to the wiring 19.

The transistor 34 also has a function of bringing the transistor 13*t* into the off state from the on state, and the transistor 36 also has a function of keeping the transistor 13*t* in the off state. Accordingly, the time required for bringing the transistor 13*t* into the off state from the on state can be shortened in the case where the transistor 34 has high current supply capability; thus, the channel width W of the transistor 34 is preferably wider than that of the transistor 36.

The transistor 35 also has a function of bringing the transistor 14t into the off state from the on state, and the transistor 37 also has a function of keeping the transistor 14t in the off state. Accordingly, the time required for bringing the transistor 14t into the off state from the on state can be shortened in the case where the transistor 35 has high current supply capability; thus, the channel width W of the transistor 35 is preferably wider than that of the transistor 37.

The on/off state of the transistor 38 depends on the clock signal CK2 supplied to a wiring 43. The on/off state of the transistor 39 depends on the clock signal CK3 supplied to the wiring 44. When both the transistor 38 and the transistor 39 are on, the wiring 47 and the node FN2 are electrically connected to each other.

The on/off state of the transistor 40 depends on the clock signal CK4 supplied to a wiring 45. The on/off state of the transistor 41 depends on the clock signal CK1 supplied to the wiring 46. When both the transistor 40 and the transistor 41 are on, the wiring 47 and the node FN3 are electrically connected to each other. In the sequential circuit 10 illustrated in FIG. 4, the channel width W of the transistor 37 is sufficiently wider than the channel width W of the transistor 40 and the channel width W of the transistor 41. Specifically, given that the channel width W of the transistor 40 is equal to the channel width W of the transistor 41, the channel width W of the transistor 37 is sufficiently wider than at least half the channel width W of the transistor 40.

The transistor 42 has a function of controlling the electrical connection between the wiring 47 and the node FN2 in response to the signal RIN.

The transistor 12t has a function of controlling the electrical connection between the wiring 46 and the wiring 19 in response to the potential of the node FN1. The transistor 13t has a function of controlling the electrical connection between the wiring 16 and the wiring 19 in response to the potential of the node FN2. The transistor 14t has a function of controlling the electrical connection between the wiring 16 and the wiring 19 in response to the potential of the node FN3.

The wiring 47 has functions of the wiring 15, the wiring 28, and the wiring 30 illustrated in FIG. 3. That is, the sequential circuit 10 illustrated in FIG. 4 has a structure in which the potential VDD1, the potential VDD3, and the potential VDD5 are at the same level in the sequential circuit 10 illustrated in FIG. 3.

The wiring 46 has a function of the wiring 17 illustrated in FIG. 3. That is, the high-level potential of the clock signal CK1 corresponds to the potential VDD2 in the sequential circuit 10 illustrated in FIG. 3. Note that in this embodiment, in the sequential circuit 10 illustrated in FIG. 4, the high-level potential of the clock signal CK1 is at the same level as the potential VDD1.

In FIG. 4, the wiring 16 has a function of the wiring 18 illustrated in FIG. 3. That is, the sequential circuit 10 illustrated in FIG. 4 has a structure in which the potential VSS1 and the potential VSS2 are at the same level in the sequential circuit 10 illustrated in FIG. 3.

Next, an example of the operation of the sequential circuit 10 illustrated in FIG. 4 will be described with reference to a timing diagram in FIG. 5. FIGS. 6A to 6C, FIGS. 7A to 7C, FIGS. 8A to 8C, and FIG. 9 schematically illustrate operations in periods T1 to T10 respectively. In FIGS. 6A to 6C, FIGS. 7A to 7C, FIGS. 8A to 8C, and FIG. 9, only signals supplied to the wirings are illustrated, and reference numerals denoting the wirings are not illustrated.

Figure 5:
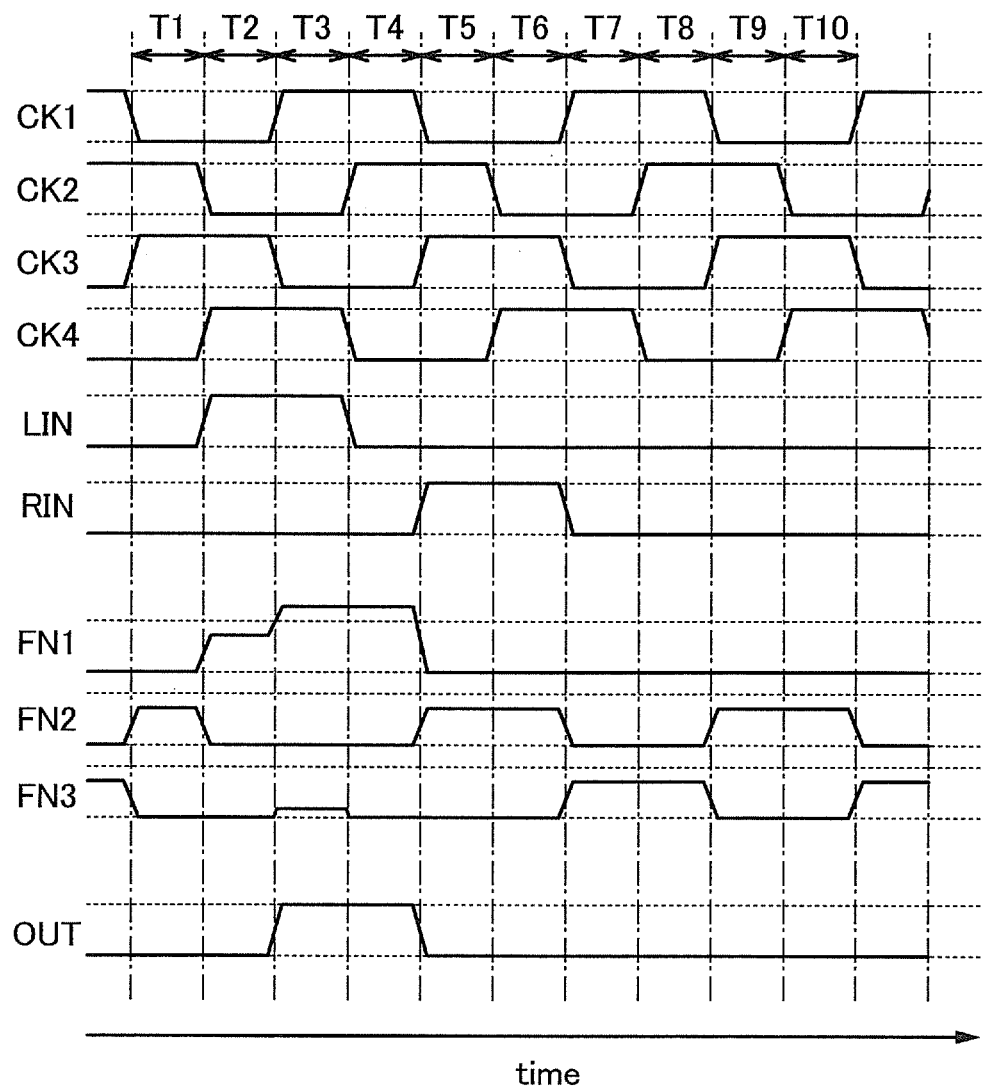
FIG. 5 is a timing diagram of the sequential circuit.

As shown in FIG. 5, in the period T1, the potentials of the clock signals CK1, CK2, CK3, and CK4 are at low level (L), high level (H), high level (H), and low level (L) respectively, the potential of the signal LIN is at low level (L), and the potential of the signal RIN is at low level (L).

Figure 6A:
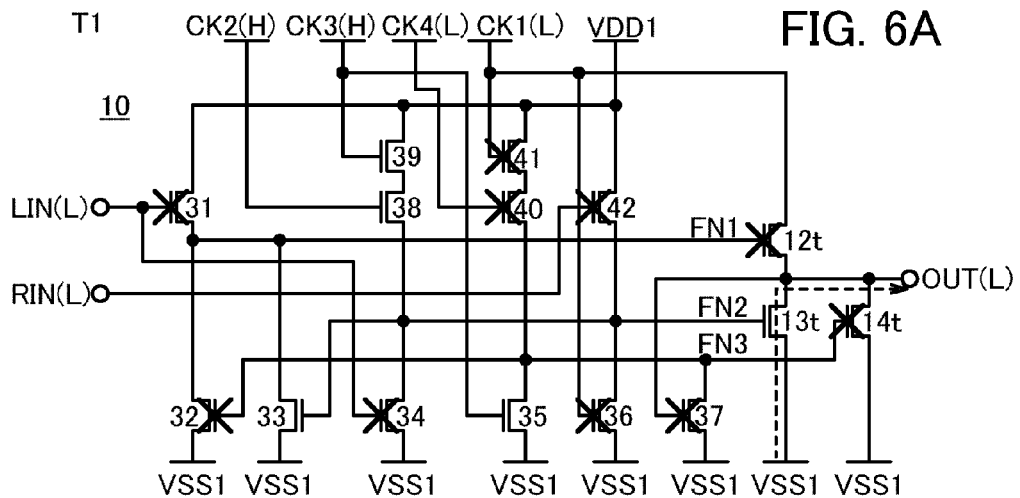
FIGS. 6A to 6C illustrate the operations of the sequential circuit.

Therefore, in the period T1, the node FN1 is supplied with the potential VSS1 because the transistor 33 is on as illustrated in FIG. 6A. Thus, the transistor 12t is off. Further, in the period T1, the node FN3 is supplied with the potential VSS1 because the transistor 35 is on as illustrated in FIG. 6A. Thus, the transistor 14t is off. Further, in the period T1, the node FN2 is supplied with a potential lower than the potential VDD1 by the threshold voltages of the transistors 38 and 39 because both the transistor 38 and the transistor 39 are on as illustrated in FIG. 6A. Thus, the transistor 13t is on, and the wiring 19 is supplied with the potential VSS1 as the potential of the output signal OUT.

Next, as shown in FIG. 5, in the period T2, the potentials of the clock signals CK1, CK2, CK3, and CK4 are at low level (L), low level (L), high level (H), and high level (H) respectively, the potential of the signal LIN is at high level (H), and the potential of the signal RIN is at low level (L).

Figure 6B:
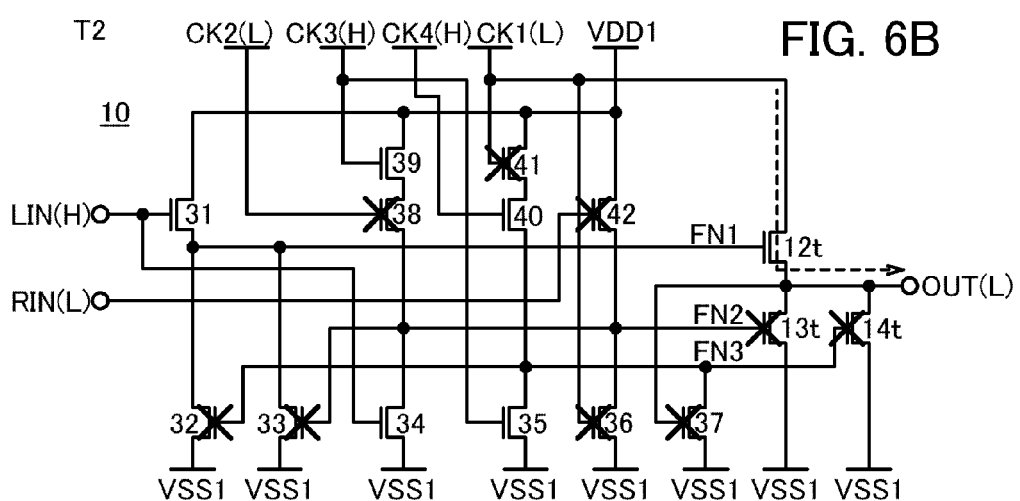

Therefore, in the period T2, the node FN2 is supplied with the potential VSS1 because the transistor 34 is on as illustrated in FIG. 6B. Thus, the transistor 13t is off. Further, in the period T2, the node FN3 is supplied with the potential VSS1 because the transistor 35 is on as illustrated in FIG. 6B. Thus, the transistor 14t is off. Further, at the beginning in the period T2, the potential of the node FN1 is raised because the transistor 31 is on as illustrated in FIG. 6B. Accordingly, the transistor 12t is turned on, and thus the wiring 19 is supplied with the low-level (L) potential of the clock signal CK1 as the output signal OUT. The potential of the node FN1 is raised to a potential lower than the potential VDD1 by the threshold voltage of the transistor 31, so that the transistor 31 is turned off. Accordingly, the node FN1 is brought into a floating state, and the potential thereof is held.

Next, as shown in FIG. 5, in the period T3, the potentials of the clock signals CK1, CK2, CK3, and CK4 are at high level (H), low level (L), low level (L), and high level (H) respectively, the potential of the signal LIN is at high level (H), and the potential of the signal RIN is at low level (L).

Figure 6C:
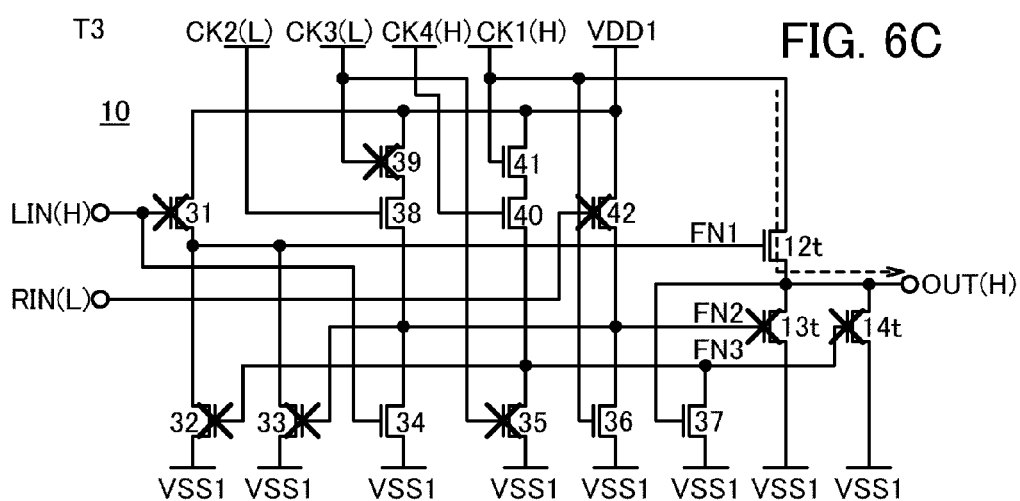

Therefore, in the period T3, the node FN2 is supplied with the potential VSS1 because the transistor 34 and the transistor 36 are on as illustrated in FIG. 6C. Thus, the transistor 13t is off. Further, in the period T3, the transistor 37, the transistor 40, and the transistor 41 are on as illustrated in FIG. 6C. As described above, since the channel width W of the transistor 37 is sufficiently wider than the channel width W of the transistor 40 and the channel width W of the transistor 41, the potential of the node FN3 is kept at a value close to the potential VSS1. Thus, the transistor 14t is off. Further, in the period T3, the node FN1 is kept in a floating state because the transistor 31 is off as illustrated in FIG. 6C. Although the potential of the clock signal CK1 supplied to one of a source and a drain of the transistor 12t is at low level in the period T2, it becomes high level in the period T3; thus, the potential of the node FN1 is raised by a voltage corresponding to the amplitude of the clock signal owing to bootstrap operation. As a result, the transistor 12t is turned on, and the wiring 19 is supplied with the high-level potential VDD1 of the clock signal CK1 as the potential of the output signal OUT.

Next, as shown in FIG. 5, in the period T4, the potentials of the clock signals CK1, CK2, CK3, and CK4 are at high level (H), high level (H), low level (L), and low level (L) respectively, the potential of the signal LIN is at low level (L), and the potential of the signal RIN is at low level (L).

Figure 7A:
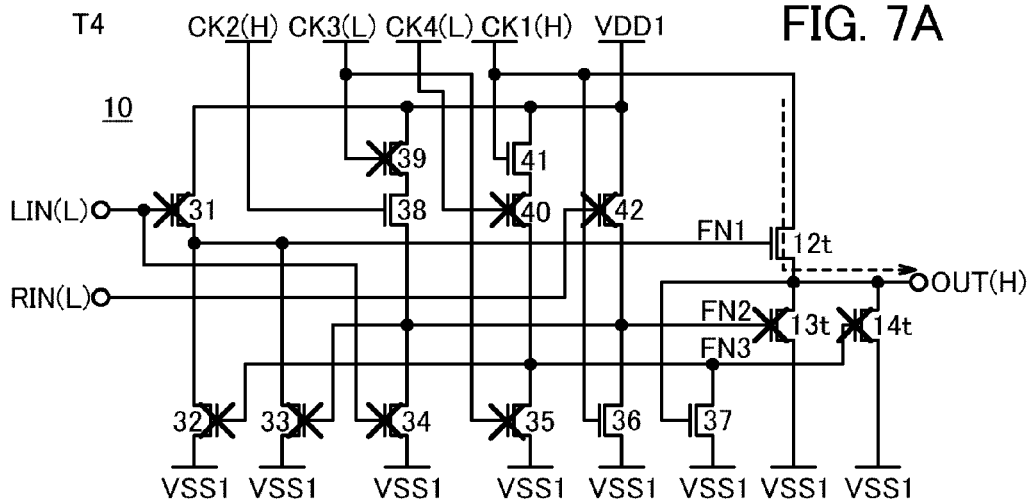
FIGS. 7A to 7C illustrate the operations of the sequential circuit.

Therefore, in the period T4, the node FN2 is supplied with the potential VSS1 because the transistor 36 is on as illustrated in FIG. 7A. Thus, the transistor 13t is off. Further, in the period T4, the node FN3 is supplied with the potential VSS1 because the transistor 37 is on as illustrated in FIG. 7A. Thus, the transistor 14t is off. Further, in the period T4, the node FN1 is kept in a floating state because the transistor 31 is off as illustrated in FIG. 7A. That is, the potential of the node FN1 raised in the period T3 is held, whereby the transistor 12t is kept on. As a result, the wiring 19 is supplied with the high-level potential VDD1 of the clock signal CK1 as the potential of the output signal OUT.

Next, as shown in FIG. 5, in the period T5, the potentials of the clock signals CK1, CK2, CK3, and CK4 are at low level (L), high level (H), high level (H), and low level (L) respectively, the potential of the signal LIN is at low level (L), and the potential of the signal RIN is at high level (H).

Figure 7B:
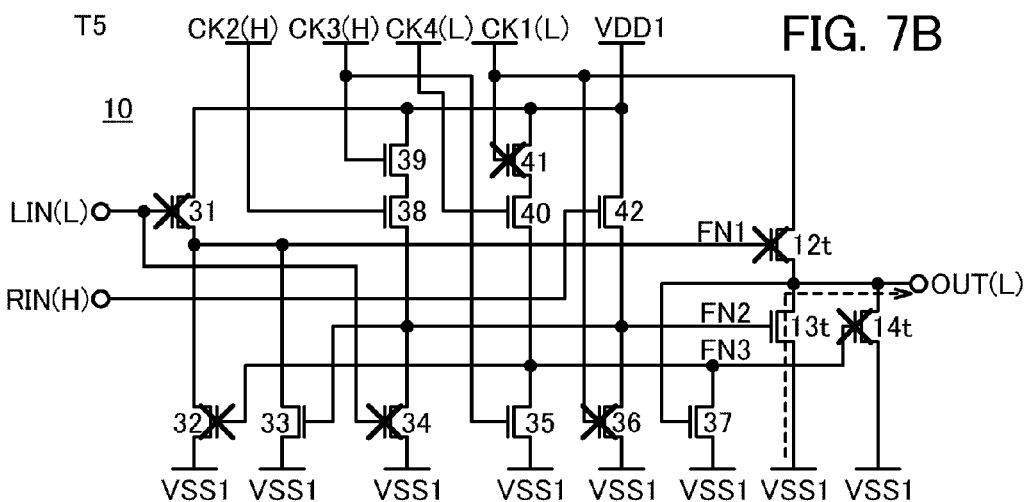

Therefore, in the period T5, the node FN1 is supplied with the potential VSS1 because the transistor 33 is on as illustrated in FIG. 7B. Thus, the transistor 12t is off. Further, in the period T5, the node FN3 is supplied with the potential VSS1 because the transistors 35 and 37 are on as illustrated in FIG. 7B. Thus, the transistor 14t is off. In the period T5, the transistor 38, the transistor 39, and the transistor 42 are on as illustrated in FIG. 7B. The node FN2 is supplied with a potential lower than the potential VDD1 by the threshold voltages of the transistors 38 and 39 or a potential lower than the potential VDD1 by the threshold voltage of the transistor 42. Thus, the transistor 13t is on, and the wiring 19 is supplied with the potential VSS1 as the potential of the output signal OUT.

Next, as shown in FIG. 5, in the period T6, the potentials of the clock signals CK1, CK2, CK3, and CK4 are at low level (L), low level (L), high level (H), and high level (H) respectively, the potential of the signal LIN is at low level (L), and the potential of the signal RIN is at high level (H).

Figure 7C:
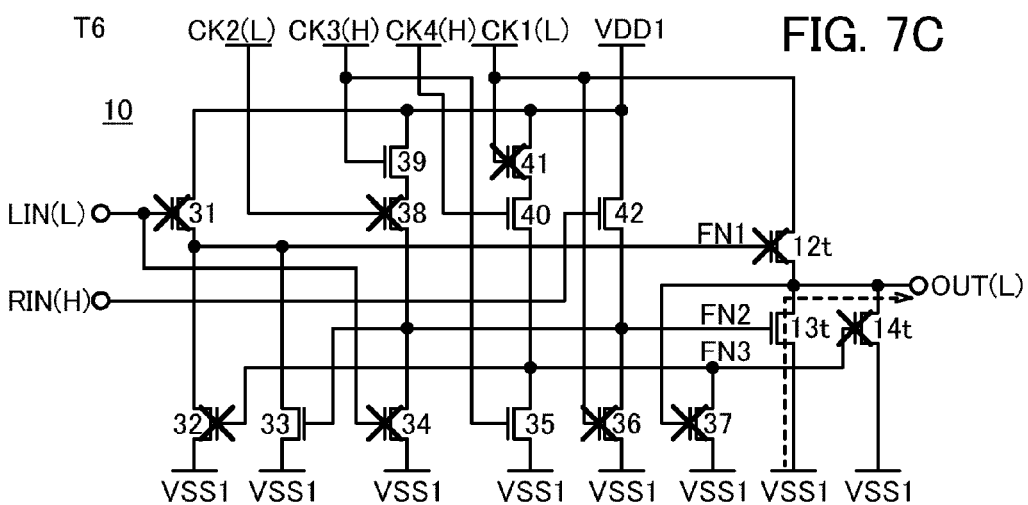

Therefore, in the period T6, the node FN1 is supplied with the potential VSS1 because the transistor 33 is on as illustrated in FIG. 7C. Thus, the transistor 12t is off. Further, in the period T6, the node FN3 is supplied with the potential VSS1 because the transistor 35 is on as illustrated in FIG. 7C. Thus, the transistor 14t is off. Further, in the period T6, the node FN2 is supplied with a potential lower than the potential VDD1 by the threshold voltage of the transistor 42 because the transistor 42 is on as illustrated in FIG. 7C. Thus, the transistor 13t is on, and the wiring 19 is supplied with the potential VSS1 as the potential of the output signal OUT.

Next, as shown in FIG. 5, in the period T7, the potentials of the clock signals CK1, CK2, CK3, and CK4 are at high level (H), low level (L), low level (L), and high level (H) respectively, the potential of the signal LIN is at low level (L), and the potential of the signal RIN is at low level (L).

Figure 8A:
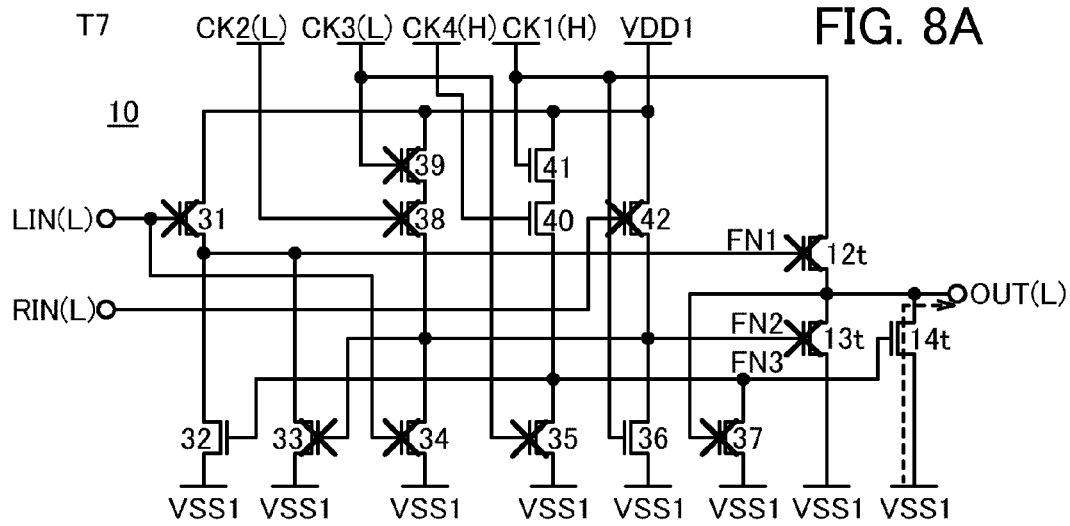
FIGS. 8A to 8C illustrate the operations of the sequential circuit.

Therefore, in the period T7, the node FN1 is supplied with the potential VSS1 because the transistor 32 is on as illustrated in FIG. 8A. Thus, the transistor 12t is off. Further, in the period T7, the node FN2 is supplied with the potential VSS1 because the transistor 36 is on as illustrated in FIG. 8A. Thus, the transistor 13t is off. Further, in the period T7, the node FN3 is supplied with a potential lower than the potential VDD1 by the threshold voltages of the transistors 40 and 41 because the transistor 40 and the transistor 41 are on as illustrated in FIG. 8A. Thus, the transistor 14t is on, and the wiring 19 is supplied with the potential VSS1 as the potential of the output signal OUT.

Next, as shown in FIG. 5, in the period T8, the potentials of the clock signals CK1, CK2, CK3, and CK4 are at high level (H), high level (H), low level (L), and low level (L) respectively, the potential of the signal LIN is at low level (L), and the potential of the signal RIN is at low level (L).

Figure 8B:
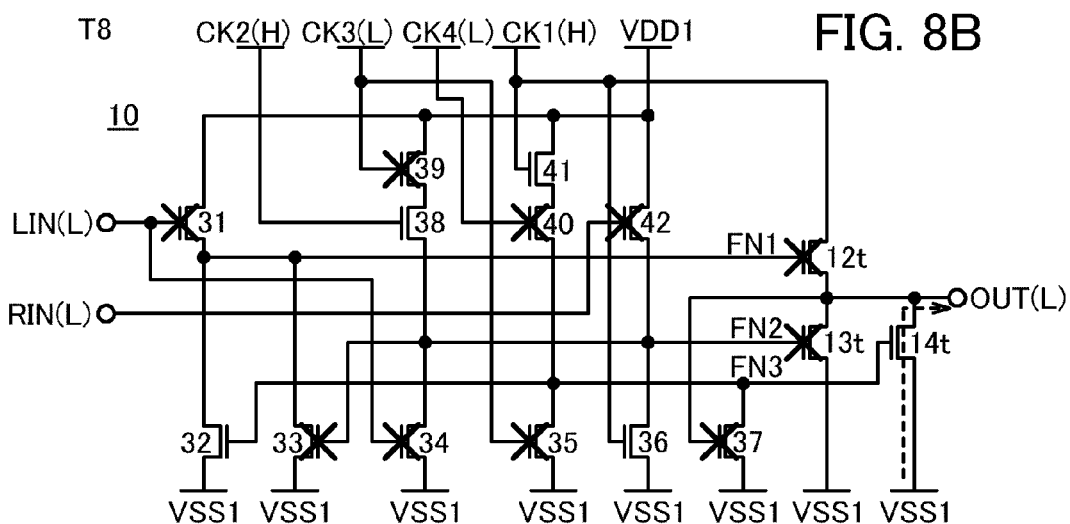

Therefore, in the period T8, the node FN1 is supplied with the potential VSS1 because the transistor 32 is on as illustrated in FIG. 8B. Thus, the transistor 12t is off. Further, in the period T8, the node FN2 is supplied with the potential VSS1 because the transistor 36 is on as illustrated in FIG. 8B. Thus, the transistor 13t is off. Further, in the period T8, the node FN3 is in a floating state as illustrated in FIG. 8B. Therefore, the node FN3 holds a potential that is lower than the potential VDD1 by the threshold voltages of the transistors 40 and 41 and is supplied in the period T7; thus, the transistor 14t is kept on. As a result, the wiring 19 is supplied with the potential VSS1 as the potential of the output signal OUT.

Next, as shown in FIG. 5, in the period T9, the potentials of the clock signals CK1, CK2, CK3, and CK4 are at low level (L), high level (H), high level (H), and low level (L) respectively, the potential of the signal LIN is at low level (L), and the potential of the signal RIN is at low level (L).

Figure 8C:
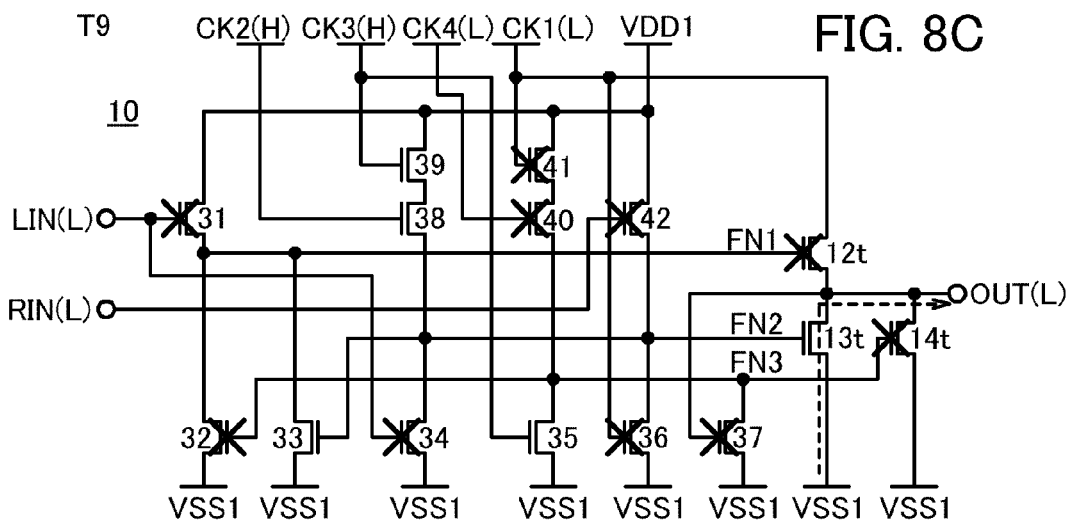

Therefore, in the period T9, the node FN1 is supplied with the potential VSS1 because the transistor 33 is on as illustrated in FIG. 8C. Thus, the transistor 12t is off. Further, in the period T9, the node FN3 is supplied with the potential VSS1 because the transistor 35 is on as illustrated in FIG. 8C. Thus, the transistor 14t is off. Further, in the period T9, the node FN2 is supplied with a potential lower than the potential VDD1 by the threshold voltages of the transistors 38 and 39 because the transistor 38 and the transistor 39 are on as illustrated in FIG. 8C. Thus, the transistor 13t is on, and the wiring 19 is supplied with the potential VSS1 as the potential of the output signal OUT.

Next, as shown in FIG. 5, in the period T10, the potentials of the clock signals CK1, CK2, CK3, and CK4 are at low level (L), low level (L), high level (H), and high level (H) respectively, the potential of the signal LIN is at low level (L), and the potential of the signal RIN is at low level (L).

Figure 9:
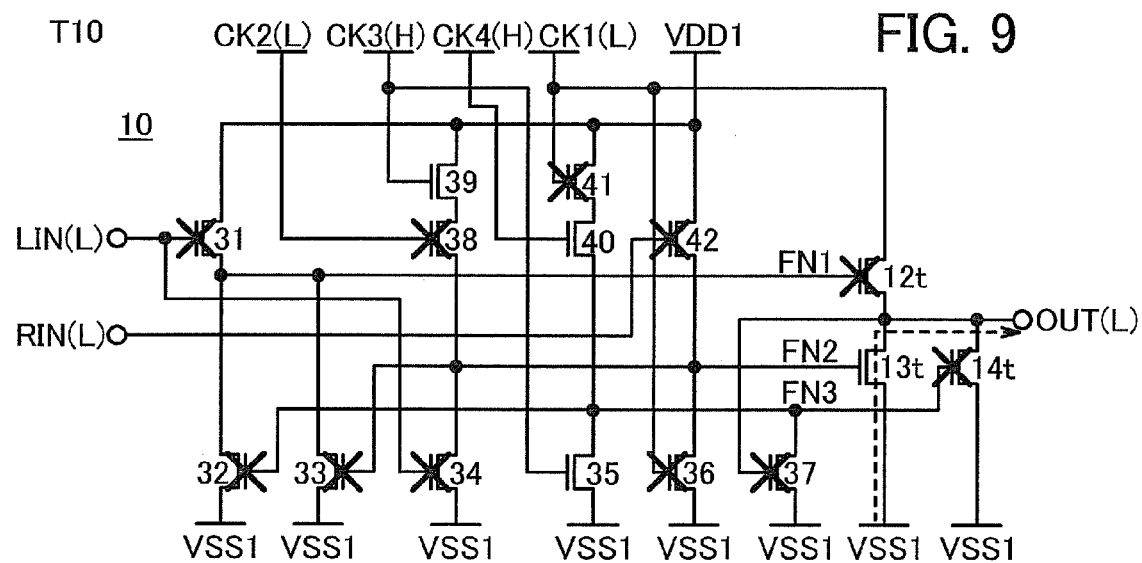
FIG. 9 illustrates the operation of the sequential circuit.

Therefore, in the period T10, the node FN3 is supplied with the potential VSS1 because the transistor 35 is on as illustrated in FIG. 9. Thus, the transistor 14t is off. Further, in the period T10, the node FN1 is in a floating state as illustrated in FIG. 9. Therefore, the node FN1 holds the potential VSS1 that is supplied in the period T9; thus, the transistor 12t is kept off. Further, in the period T10, the node FN2 is in a floating state as illustrated in FIG. 9. Therefore, the node FN2 holds a potential that is lower than the potential VDD1 by the threshold voltages of the transistors 38 and 39 and is supplied in the period T9; thus, the transistor 13t is kept on. As a result, the wiring 19 is supplied with the potential VSS1 as the potential of the output signal OUT.

In one embodiment of the present invention, the operations in the periods T7 to T10 are repeated after the period T10, whereby the potential of the output signal OUT can be kept in the period other than the period during which the pulse is output. For such a reason, in one embodiment of the present invention, one of the transistor 13t and the transistor 14t does not need to be continuously on in the period other than the period during which the pulse is output; thus, a deterioration in electric characteristics of the transistor on the output side, such as a shift in threshold voltage, can be prevented, and the reliability of not only the sequential circuit 10 but also the semiconductor device using the sequential circuit 10 can be improved.

Figure 10:
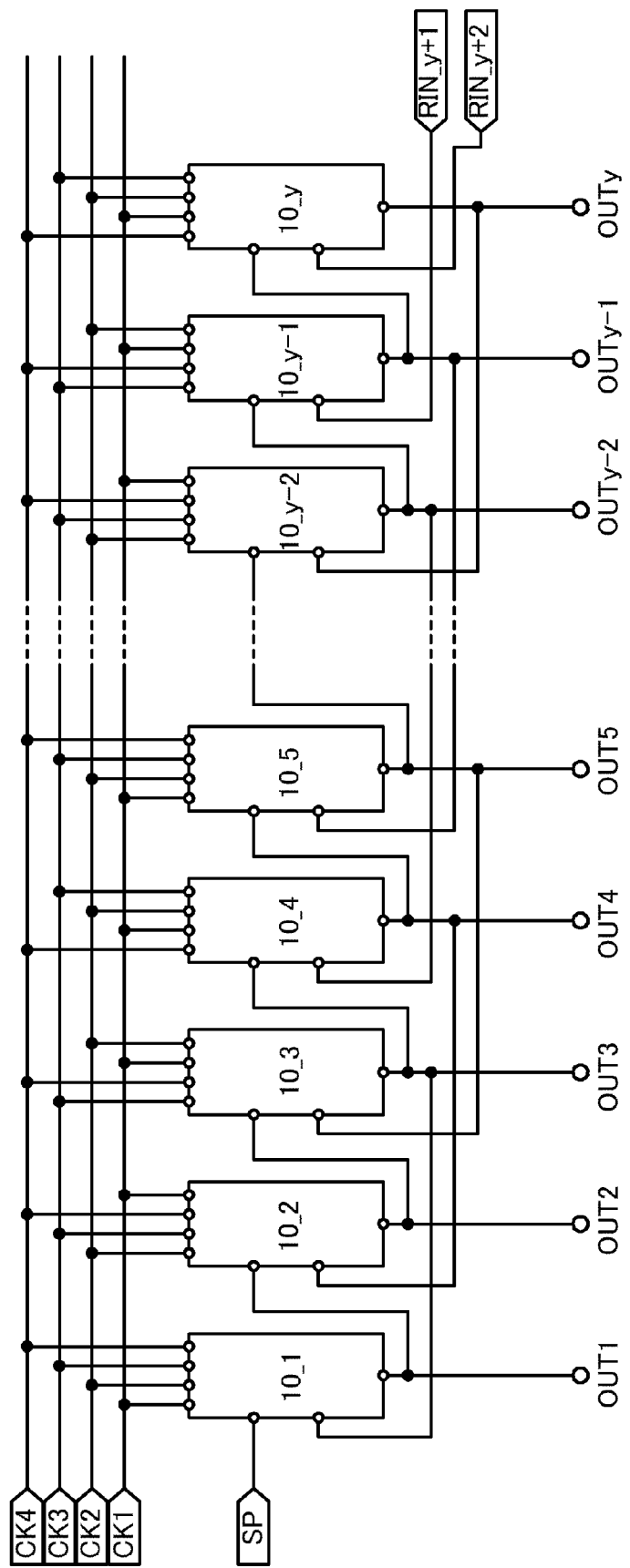
FIG. 10 illustrates the configuration of a shift register.

FIG. 10 illustrates an example of a shift register in which a plurality of sequential circuits 10 illustrated in FIG. 4 is connected.

The shift register illustrated in FIG. 10 includes sequential circuits 10_1 to 10_y (y is a natural number of 2 or more). Each of the sequential circuits 10_1 to 10_y has the same structure as the sequential circuit 10 illustrated in FIG. 4. Note that the wiring 43, the wiring 44, the wiring 45, and the wiring 46 are supplied with the clock signal CK2, the clock signal CK3, the clock signal CK4, and the clock signal CK1 respectively in the sequential circuit 10 illustrated in FIG. 4; however, in FIG. 10, the wiring 43, the wiring 44, the wiring 45, and the wiring 46 are not necessarily supplied with the same clock signals as those in the sequential circuit 10 illustrated in FIG. 4.

Specifically, in the sequential circuit 10_4m+1, the wiring 46, the wiring 43, the wiring 44, and the wiring 45 are supplied with the clock signal CK1, the clock signal CK2, the clock signal CK3, and the clock signal CK4 respectively. In the sequential circuit 10_4m+2, the wiring 46, the wiring 43, the wiring 44, and the wiring 45 are supplied with the clock signal CK2, the clock signal CK3, the clock signal CK4, and the clock signal CK1 respectively. In the sequential circuit 10_4m+3, the wiring 46, the wiring 43, the wiring 44, and the wiring 45 are supplied with the clock signal CK3, the clock signal CK4, the clock signal CK1, and the clock signal CK2 respectively. In the sequential circuit 10_4m+4, the wiring 46, the wiring 43, the wiring 44, and the wiring 45 are supplied with the clock signal CK4, the clock signal CK1, the clock signal CK2, and the clock signal CK3 respectively. Note that m is a given integer that meets the condition that the total number of the sequential circuits 10 is y.

Figure 11:
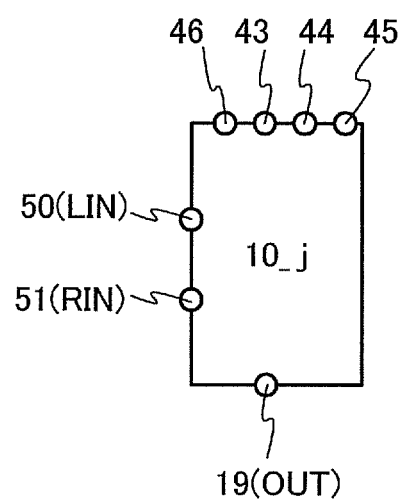
FIG. 11 schematically illustrates a j-th sequential circuit $10\_j$.

FIG. 11 schematically illustrates the positions of the wirings connected to the sequential circuit 10_j (j is a natural number of y or less) in the shift register illustrated in FIG. 10. As is clear from FIG. 10 and FIG. 11, in the sequential circuit 10_j, a wiring 50 is supplied with, as the signal LIN, an output signal OUTj−1 that is output from the wiring 19 in the sequential circuit 10_j−1 in the previous stage. Note that the wiring 50 in the sequential circuit 10_1 in the first stage is supplied with the potential of a start pulse signal SP.

A wiring 51 in the sequential circuit 10_j is supplied with, as the signal RIN, an output signal OUTj+2 that is output from the wiring 19 in the sequential circuit 10_j+2 in the stage following the next stage. Note that the wiring 51 in the sequential circuit 10_y−1 in the (y−1)-th stage is supplied with a signal RIN_y+1, and the wiring 51 in the sequential circuit 10_y in the y-th stage is supplied with a signal RIN_y+2. The potential RIN_y−1 is an output signal OUTy+1 that may be output from the sequential circuit 10_y+1 assuming that the sequential circuit 10_y+1 is provided. Further, the potential RIN_y is an output signal OUTy+2 that may be output from the sequential circuit 10_y+2 assuming that the sequential circuit 10_y+2 is provided.

Embodiment 2

In this embodiment, an example of the configuration of a panel in which a liquid crystal element is used as a display element will be described.

Figure 12A:
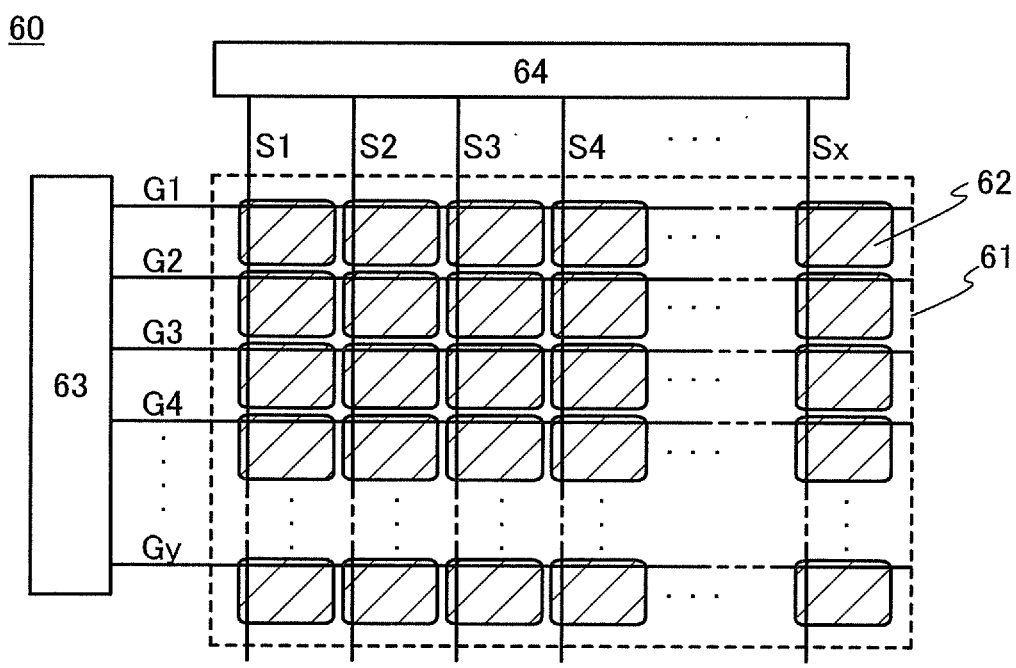
FIGS. 12A and 12B illustrate the configuration of a panel.

In a panel 60 illustrated in FIG. 12A, a pixel portion 61 includes a plurality of pixels 62, a plurality of scan lines G for selecting the pixels 62 on a row basis, and a plurality of signal lines S for supplying image signals to the selected pixels 62. The input of signals to the scan lines G is controlled by a scan line driver circuit 63. The input of image signals to the signal lines S is controlled by a signal line driver circuit 64. Each of the plurality of pixels 62 is connected to at least one of the scan lines G and at least one of the signal lines S.

The scan line driver circuit 63 includes a shift register which generates pulse signals. The pulse signals are sequentially input to the scan lines G. A sequential circuit of one embodiment of the present invention can be used for the shift register in the scan line driver circuit 63.

Note that the kinds and number of wirings provided in the pixel portion 61 depend on the configuration, number, and arrangement of the pixels 62. Specifically, in the pixel portion 61 illustrated in FIG. 12A, the pixels 62 are arranged in a matrix of x rows and y columns (x and y are each a natural number of 2 or more), and the signal lines S1 to Sx and the scan lines G1 to Gy are provided in the pixel portion 61.

Figure 12B:
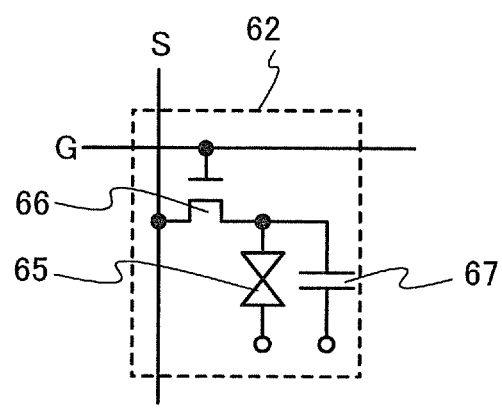

FIG. 12B illustrates an example of the configuration of the pixel 62. The pixel 62 includes a liquid crystal element 65, a transistor 66 for controlling supply of an image signal to the liquid crystal element 65, and a capacitor 67 for holding a voltage between a first electrode and a second electrode of the liquid crystal element 65. The liquid crystal element 65 includes the first electrode, the second electrode, and a liquid crystal layer including a liquid crystal material to which the voltage between the first electrode and the second electrode is applied.

The transistor 66 controls whether to supply the potential of the signal line S to the first electrode of the liquid crystal element 65. A predetermined reference potential Vcom is supplied to the second electrode of the liquid crystal element 65.

The connection relation between the transistor 66 and the liquid crystal element 65 will be specifically described below. In FIG. 12B, a gate of the transistor 66 is connected to one of the scan lines G1 to Gy. One of a source and a drain of the transistor 66 is connected to one of the signal lines S1 to Sx, and the other thereof is connected to the first electrode of the liquid crystal element 65.

Note that the pixel 62 may further include another circuit element such as a transistor, a diode, a resistor, a capacitor, or an inductor as needed.

In the example illustrated in FIG. 12B, in the pixel 62, one transistor 66 is used as a switch for controlling the input of an image signal to the pixel 62. However, a plurality of transistors functioning as one switch may be used in the pixel 62. In the case where a plurality of transistors functions as one switch, the plurality of transistors may be connected to each other in parallel, in series, or in combination of parallel connection and series connection.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

In one embodiment of the present invention, in the pixel 62, a transistor whose off-state current is small is preferably used as a switch for holding electric charge accumulated in the liquid crystal element 65 and the capacitor 67. Specifically, in the case of the pixel 62 illustrated in FIG. 12B, electric charge can be prevented from leaking through the transistor 66 when the off-state current of the transistor 66 is small. Therefore, the potential of an image signal supplied to the liquid crystal element 65 and the capacitor 67 can be held more surely, and thus a change in the transmittance of the liquid crystal element 65 in one frame period due to leakage of electric charge can be prevented. As a result, the quality of a displayed image can be improved. Further, since electric charge can be prevented from leaking through the transistor 66 when the off-state current of the transistor 66 is small, the area of the capacitor 67 can be made small. Accordingly, the transmittance of the panel 60 can be improved, and thus the loss of light supplied from a light supply portion such as a backlight or a frontlight in the panel 60 can be reduced. As a result, the power consumption of a liquid crystal display device can be reduced.

The panel in which the liquid crystal element is used as a display element is described in this embodiment; however, a light-emitting element may be used as a display element.

The light-emitting element includes, in its category, an element whose luminance is controlled by current or voltage; examples thereof are a light-emitting diode (LED) and an organic light-emitting diode (OLED). An OLED includes at least an EL layer, an anode, and a cathode, for example. The EL layer is formed using a single layer or a plurality of layers provided between the anode and the cathode, at least one of which is a light-emitting layer containing a light-emitting substance.

From the EL layer, electroluminescence is obtained by current supplied when a potential difference between the cathode and the anode is higher than or equal to the threshold voltage Vthe of the light-emitting element. As electroluminescence, there are luminescence (fluorescence) at the time of returning from a singlet-excited state to a ground state and luminescence (phosphorescence) at the time of returning from a triplet-excited state to a ground state.

This embodiment can be implemented in combination with any of the other embodiments as appropriate.

Embodiment 3

In a semiconductor device of one embodiment of the present invention, a transistor may include a channel formation region in a semiconductor film of amorphous, microcrystalline, polycrystalline, or single crystal silicon, germanium, or the like. Alternatively, the transistor may include a channel formation region in a semiconductor film whose bandgap is wider than that of silicon and whose intrinsic carrier density is lower than that of silicon. As silicon, any of the following can be used, for example: amorphous silicon manufactured by sputtering or vapor deposition such as plasma CVD, polycrystalline silicon obtained by crystallization of amorphous silicon by treatment such as laser annealing, and single crystal silicon obtained in such a manner that a surface portion of a single crystal silicon wafer is separated after implantation of hydrogen ions or the like into the silicon wafer.

Note that a highly purified oxide semiconductor (purified oxide semiconductor) obtained by a reduction of impurities such as moisture and hydrogen that serve as electron donors (donors) and by a reduction of oxygen vacancies is an intrinsic (i-type) semiconductor or a substantially intrinsic semiconductor. For this reason, a transistor having a channel formation region in a highly purified oxide semiconductor film has extremely small off-state current and high reliability.

Specifically, various experiments can prove a small off-state current of a transistor having a channel formation region in a highly purified oxide semiconductor film. For example, the off-state current of even an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between a source electrode and a drain electrode (a drain voltage) of 1 V to 10 V. In this case, it can be seen that the off-state current standardized on the channel width of the transistor is smaller than or equal to 100 zA/μm. In addition, the off-state current is measured using a circuit in which a capacitor and a transistor are connected to each other and electric charge flowing into or from the capacitor is controlled by the transistor. In the measurement, a highly purified oxide semiconductor film is used for a channel formation region of the transistor, and the off-state current of the transistor is measured from a change in the amount of electric charge of the capacitor per unit time. As a result, it is found that when the voltage between the source electrode and the drain electrode of the transistor is 3 V, a smaller off-state current of several tens of yoctoamperes per micrometer (yA/μm) is obtained. Consequently, the transistor in which a highly purified oxide semiconductor film is used for a channel formation region has much smaller off-state current than a transistor including crystalline silicon.

Unless otherwise specified, in the case of an n-channel transistor, off-state current in this specification is a current which flows between a source and a drain when, in the state where the potential of the drain is higher than that of the source and that of a gate, the potential of the gate is less than or equal to zero with respect to the potential of the source. Furthermore, in this specification, in the case of a p-channel transistor, off-state current is a current which flows between a source and a drain when, in the state where the potential of the drain is lower than that of the source or that of a gate, the potential of the gate is greater than or equal to zero with respect to the potential of the source.

Next, an example of a transistor including a channel formation region in an oxide semiconductor film will be described with reference to drawings.

Figure 13A:
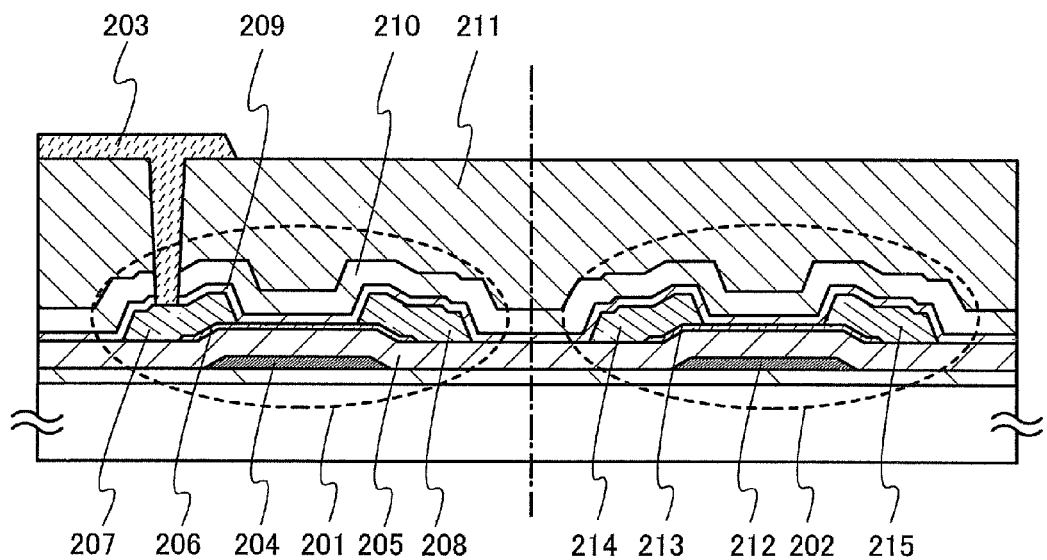
FIGS. 13A and 13B each illustrate the cross-sectional structure of a transistor.

FIG. 13A illustrates an example of a cross-sectional structure of a transistor 201 provided in a pixel and a transistor 202 provided in a driver circuit.

The transistor 201 in FIG. 13A includes a conductive film 204 that is provided over an insulating surface and functions as a gate, an insulating film 205 over the conductive film 204, a semiconductor film 206 that overlaps with the conductive film 204 over the insulating film 205, and conductive films 207 and 208 that are provided over the semiconductor film 206 and function as a source and a drain. In FIG. 13A, insulating films 209 and 210 are sequentially stacked over the semiconductor film 206 and the conductive films 207 and 208. The transistor 201 may include the insulating films 209 and 210.

An insulating film 211 formed using a resin is provided over the insulating films 209 and 210. An opening is provided in the insulating films 209, 210, and 211, and the conductive film 203 that is connected to the conductive film 207 through the opening is provided over the insulating film 211. The conductive film 203 functions as a first electrode of a display element.

For example, a liquid crystal element includes a first electrode and a second electrode, and a liquid crystal layer to which an electric field is applied by the first electrode and the second electrode. Thus, in the case where the liquid crystal element is formed over the transistor 201, in addition to the conductive film 203, a liquid crystal layer and a conductive film functioning as the second electrode may be provided over the insulating film 211.

When the display element is an OLED, in addition to the conductive film 203 functioning as one of an anode and a cathode, an EL layer and a conductive film functioning as the other of the anode and the cathode may be provided over the insulating film 211.

The use of a resin for the insulating film 211 can prevent generation of unevenness on a surface where the conductive film 203 is formed, that is, can increase the flatness of the surface where the conductive film 203 is formed.

Specifically, an organic material such as an acrylic resin, an epoxy resin, a benzocyclobutene-based resin, polyimide, or polyamide can be used for the insulating film 211. As an alternative to the organic material, it is possible to use a silicone resin or the like. Note that the insulating film 211 having higher flatness can be formed by stacking a plurality of insulating films formed using these materials.

Specifically, for the conductive film 203, any of indium oxide, indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. Other examples are elements that belong to Group 1 or 2 in the periodic table, for example, an alkali metal such as lithium (Li) or cesium (Cs) and an alkaline earth metal such as magnesium (Mg), calcium (Ca), or strontium (Sr), an alloy containing such an element (e.g., MgAg or AlLi), a rare earth metal such as europium (Eu) or ytterbium (Yb), and an alloy containing such an element. Note that the conductive film 203 can be formed in such a manner that, for example, a conductive film is formed using the above material by sputtering or evaporation, and then the conductive film is processed into a desired shape by etching through a photolithography process.

The transistor 202 in FIG. 13A includes a conductive film 212 that is provided over an insulating surface and functions as a gate, the insulating film 205 over the conductive film 212, a semiconductor film 213 that overlaps with the conductive film 212 over the insulating film 205, and conductive films 214 and 215 that are provided over the semiconductor film 213 and function as a source and a drain. In FIG. 13A, the insulating films 209 and 210 are sequentially stacked over the semiconductor film 213 and the conductive films 214 and 215. The insulating film 211 formed using a resin is provided over the insulating films 209 and 210.

Note that in FIG. 13A, a conductive film functioning as a back gate of the transistor 202 included in the driver circuit may be formed over the insulating film 211 together with the conductive film 203 functioning as the electrode of the liquid crystal element in the pixel. With the above structure, the conductive film 203 and the conductive film functioning as the back gate can be formed by processing one conductive film into a desired shape by etching or the like. Accordingly, the conductive film functioning as the back gate can be provided without an increase in the steps of manufacturing a semiconductor device.

The back gate may be floating or may be supplied with a potential from another element. In the latter case, potentials at the same level may be applied to a normal gate (front gate) and the back gate, or a fixed potential such as a ground potential may be applied only to the back gate. By controlling the potential applied to the back gate, the threshold voltage of the transistor 202 can be controlled. By providing the back gate, a channel formation region is enlarged and drain current can be increased. Further, providing the back gate facilitates formation of a depletion layer in the semiconductor film, which results in lower subthreshold swing.

In FIG. 13A, the insulating films 209 and 210 are provided between the semiconductor films 206 and 213 and the insulating film 211. However, the number of insulating films provided between the semiconductor films 206 and 213 and the insulating film 211 may be one, or may be three or more.

The insulating film 210 preferably contains oxygen at a proportion higher than or equal to the stoichiometric composition and has a function of supplying part of oxygen to the semiconductor film 206 by heating. In addition, the number of defects in the insulating film 210 is preferably small; typically, the spin density of a signal that appears at g=2.001 due to a dangling bond of silicon is preferably $1\times10^{18}$ spins/cm$^3$ or lower when measured by ESR. Note that in the case where the semiconductor films 206 and 213 are damaged at the time of formation of the insulating film 210 when the insulating film 210 is directly formed on the semiconductor films 206 and 213, the insulating film 209 is preferably provided between the semiconductor films 206 and 213 and the insulating film 210, as illustrated in FIG. 13A. The insulating film 209 preferably causes little damage to the semiconductor films 206 and 213 when the insulating film 209 is formed as compared to the case of the insulating film 210 and preferably has a function of transmitting oxygen. If damage to the semiconductor films 206 and 213 can be reduced and the insulating film 210 can be formed directly on the semiconductor films 206 and 213, the insulating film 209 is not necessarily provided.

The number of defects in the insulating film 209 is preferably small; typically, the spin density of a signal that appears at g=2.001 due to a dangling bond of silicon is preferably $3\times10^{17}$ spins/cm$^3$ or lower when measured by ESR. This is because if the density of defects in the insulating film 209 is high, oxygen is bonded to the defects and the amount of oxygen that passes through the insulating film 209 is decreased.

Further, the number of defects at an interface between the insulating film 209 and the semiconductor films 206 and 213 is preferably small; typically, the spin density of a signal that appears at g=1.93 due to oxygen vacancies in an oxide semiconductor used for the semiconductor films 206 and 213 is preferably lower than or equal to $1\times10^{17}$ spins/cm$^3$, more preferably lower than or equal to the measurement limit when measured by ESR where a magnetic field is applied parallel to a film surface.

Specifically, as the insulating film 209 or the insulating film 210, a silicon oxide film or a silicon oxynitride film can be used.

Figure 13B:
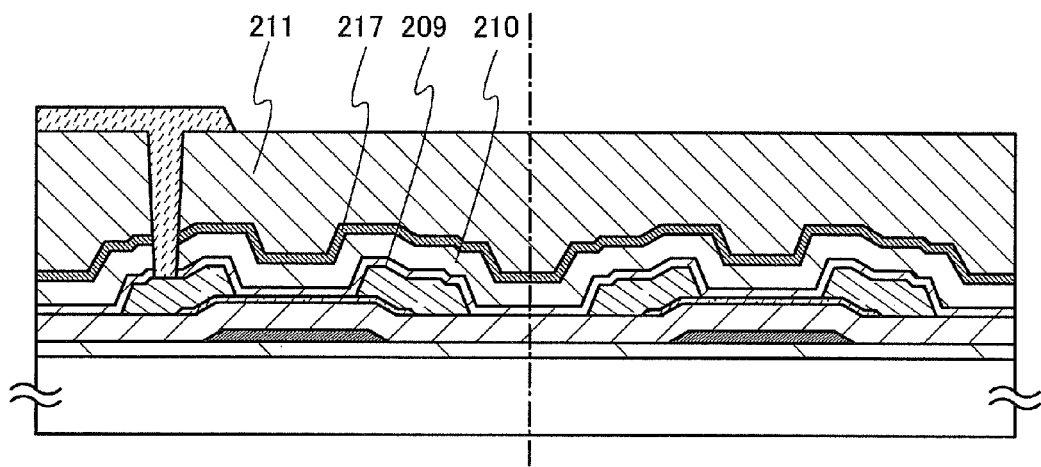

Next, FIG. 13B illustrates a cross-sectional structure of the transistor 201, the conductive film 203 connected to the transistor 201, and the transistor 202 in the case where an insulating film 217 is further provided between the insulating films 210 and 211 in the cross-sectional structure in FIG. 13A. The insulating film 217 preferably has an effect of blocking diffusion of oxygen, hydrogen, and water. Alternatively, the insulating film 217 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 217 has an effect of blocking diffusion of water, hydrogen, and the like, impurities such as water and hydrogen that exist in the insulating film 211 formed using a resin or exist outside the panel can be prevented from entering the semiconductor film 206 or 213. In the case where an oxide semiconductor is used for the semiconductor film 206 or 213, part of water or hydrogen entering the oxide semiconductor serves as an electron donor (donor). Thus, the use of the insulating film 217 having the blocking effect can prevent shifts in the threshold voltages of the transistors 201 and 202 due to generation of donors.

In addition, in the case where an oxide semiconductor is used for the semiconductor film 206 or 213, when the insulating film 217 has an effect of blocking diffusion of oxygen, diffusion of oxygen from the oxide semiconductor into the outside can be prevented. Accordingly, oxygen vacancies in the oxide semiconductor that serve as donors are reduced, so that shifts in the threshold voltages of the transistors 201 and 202 due to generation of donors can be prevented.

In the case where adhesion of the insulating films 217 and 211 is higher than that of the insulating films 210 and 211, the use of the insulating film 217 can prevent separation of the insulating film 211.

In the case where an oxide semiconductor film is used as each of the semiconductor film 206 and the semiconductor film 213, at least indium (In) or zinc (Zn) is preferably included as an oxide semiconductor. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An In—Ga—Zn-based oxide and an In—Sn—Zn-based oxide among oxide semiconductors have the following advantages over silicon carbide, gallium nitride, and gallium oxide: transistors with excellent electric characteristics can be formed by sputtering or a wet process and thus can be mass-produced easily. Further, unlike in the case of using silicon carbide, gallium nitride, or gallium oxide, with the use of the In—Ga—Zn-based oxide, a transistor with excellent electric characteristics can be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an "In—Ga—Zn-based oxide" means an oxide containing In, Ga, and Zn and there is no particular limitation on the ratio of In:Ga:Zn. The In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

For example, it is relatively easy to obtain high mobility with an In—Sn—Zn-based oxide. However, it is possible to obtain high mobility also with an In—Ga—Zn-based oxide by reducing the defect density in a bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Each of the semiconductor film 206 and the semiconductor film 213 may be a stack of a plurality of oxide semiconductor films formed using metal oxide targets with different atomic ratios of metals. For example, the semiconductor stack may be formed in such a manner that a first oxide semiconductor film is formed using a target with an atomic ratio of In:Ga:Zn of 1:1:1 and a second oxide semiconductor film is formed using a target with an atomic ratio of In:Ga:Zn of 3:1:2. Alternatively, the semiconductor stack may be formed in such a manner that a first oxide semiconductor film, a second oxide semiconductor film, and a third oxide semiconductor film are formed with targets having an atomic ratio of In:Ga:Zn of 1:3:2, 3:1:2, and 1:1:1, respectively.

Alternatively, each of the semiconductor film 206 and the semiconductor film 213 may be a stack of a plurality of oxide semiconductor films formed using metal oxide targets containing different metals.

This embodiment can be implemented in combination with any of the other embodiments as appropriate.

Embodiment 4

Figure 14A:
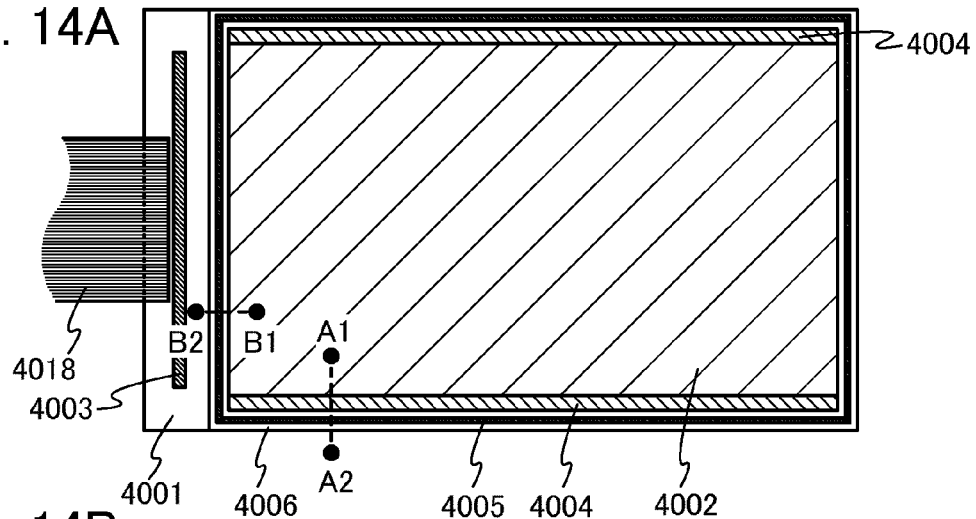
FIGS. 14A to 14C are a top view and cross-sectional views of a liquid crystal display device.
Figure 14B:
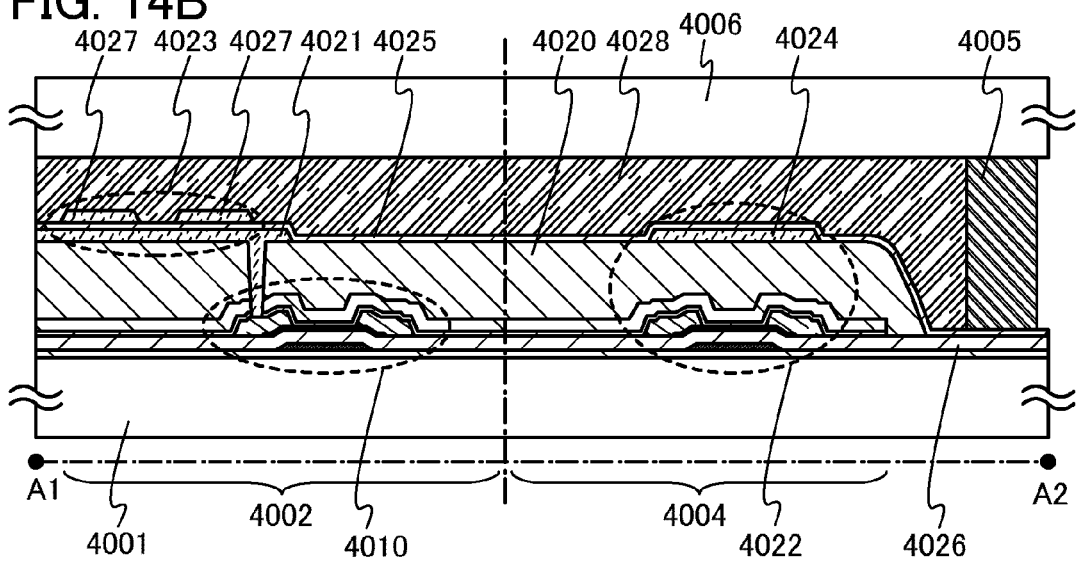
Figure 14C:
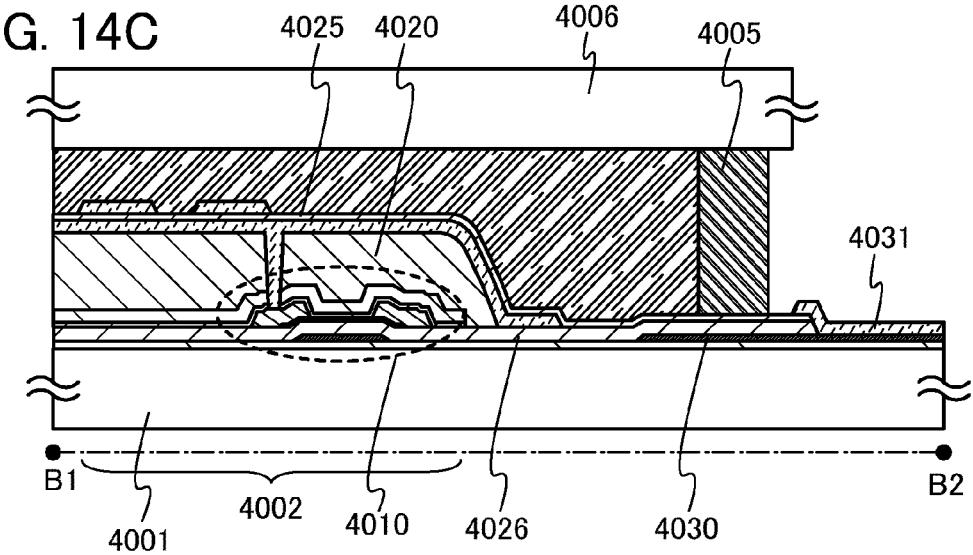

The appearance of a semiconductor device of one embodiment of the present invention will be described; in this embodiment, a liquid crystal display device will be described as an example of a semiconductor device of one embodiment of the present invention with reference to FIGS. 14A to 14C. FIG. 14A is a top view of a liquid crystal display device where a substrate 4001 and a substrate 4006 are bonded to each other with a sealant 4005. FIG. 14B corresponds to a cross-sectional view taken along broken line A1-A2 in FIG. 14A. FIG. 14C corresponds to a cross-sectional view taken along broken line B1-B2 in FIG. 14A. Note that FIGS. 14A to 14C illustrate a fringe field switching (FFS)-mode liquid crystal display device.

The sealant 4005 is provided to surround a pixel portion 4002 and a pair of scan line driver circuits 4004 provided over the substrate 4001. The substrate 4006 is provided over the pixel portion 4002 and the scan line driver circuits 4004. Thus, the pixel portion 4002 and the scan line driver circuits 4004 are sealed by the substrate 4001, the sealant 4005, and the substrate 4006.

A signal line driver circuit 4003 is mounted in a region which is different from a region surrounded by the sealant 4005 over the substrate 4001.

A plurality of transistors is included in the pixel portion 4002 and the scan line driver circuits 4004 provided over the substrate 4001. FIG. 14B illustrates a transistor 4010 included in the pixel portion 4002 and a transistor 4022 included in the scan line driver circuit 4004. FIG. 14C illustrates the transistor 4010 included in the pixel portion 4002.

In the pixel portion 4002 and the scan line driver circuit 4004, an insulating film 4020 formed using a resin is provided over the transistor 4010 and the transistor 4022. A first electrode 4021 of a liquid crystal element 4023 and a conductive film 4024 are provided over the insulating film 4020. The conductive film 4024 can function as a discharge path for electric charge accumulated in the insulating film 4020. Alternatively, the conductive film 4024 and the insulating film 4020 can be included as components of the transistor 4022, and the conductive film 4024 can function as a back gate.

An insulating film 4025 is provided over the insulating film 4020, the first electrode 4021, and the conductive film 4024. The insulating film 4025 preferably has a high effect of blocking diffusion of water, hydrogen, and the like. As the insulating film 4025, a silicon nitride film, a silicon nitride oxide film, or the like can be used.

As illustrated in FIGS. 14B and 14C, in one embodiment of the present invention, the insulating film 4020 is removed at an end portion of the panel. The insulating film 4025 over the insulating film 4020 is in contact with an insulating film 4026 functioning as a gate insulating film of each of the transistors 4010 and 4022 between the sealant 4005 and the substrate 4001.

In the case where the insulating film 4025 and the insulating film 4026 each have a high effect of blocking diffusion of water, hydrogen, and the like, when the insulating film 4025 is in contact with the insulating film 4026 at an end portion of the panel, entry of water, hydrogen, and the like from the end portion of the panel or the sealant 4005 into semiconductor films of the transistors 4010 and 4022 can be prevented.

A second electrode 4027 of the liquid crystal element 4023 is provided over the insulating film 4025. A liquid crystal layer 4028 is provided between the second electrode 4027 and the insulating film 4025, and the substrate 4006. The liquid crystal element 4023 includes the first electrode 4021, the second electrode 4027, and the liquid crystal layer 4028.

In the liquid crystal display device of one embodiment of the present invention, the liquid crystal layer can be formed using, for example, a liquid crystal material classified into a thermotropic liquid crystal or a lyotropic liquid crystal. Alternatively, the liquid crystal layer can be formed using, for example, a liquid crystal material classified into a nematic liquid crystal, a smectic liquid crystal, a cholesteric liquid crystal, or a discotic liquid crystal. Alternatively, the liquid crystal layer can be formed using, for example, a liquid crystal material classified into a ferroelectric liquid crystal or an anti-ferroelectric liquid crystal. Alternatively, the liquid crystal layer can be formed using, for example, a liquid crystal material classified into a high-molecular liquid crystal such as a main-chain high-molecular liquid crystal, a side-chain high-molecular liquid crystal, or a composite-type high-molecular liquid crystal, or a low-molecular liquid crystal. Alternatively, the liquid crystal layer can be formed using, for example, a liquid crystal material classified into a polymer dispersed liquid crystal (PDLC).

Alternatively, a liquid crystal exhibiting a blue phase for which an alignment film is not used may be used for the liquid crystal layer. A blue phase is one of liquid crystal phases that is generated just before a cholesteric phase changes into an isotropic phase while the temperature of a cholesteric liquid crystal is increased. Since the blue phase is only generated within a narrow range of temperature, a chiral material or an ultraviolet curable resin is added so that the temperature range is improved. A liquid crystal composition which includes a liquid crystal exhibiting a blue phase and a chiral material is preferable because it has a small response time of 1 msec or less, has optical isotropy, which makes the alignment process unneeded, and has a small viewing angle dependence.

In the liquid crystal element 4023, the alignment of liquid crystal molecules included in the liquid crystal layer 4028 is changed in accordance with the level of voltage applied between the first electrode 4021 and the second electrode 4027, so that transmittance is changed. Accordingly, when the transmittance of the liquid crystal element 4023 is controlled by the potential of an image signal input to the first electrode 4021, gradation can be expressed.

The liquid crystal display device of one embodiment of the present invention may display a color image by using a color filter or may display a color image by sequentially turning on a plurality of light sources whose hues are different from each other.

Image signals from the signal line driver circuit 4003 and a variety of control signals and power supply potentials from an FPC 4018 are supplied to the scan line driver circuit 4004 or the pixel portion 4002 through lead wirings 4030 and 4031.

Although a fringe field switching (FFS) mode is used as a method for driving the liquid crystal in this embodiment, the following can be used as a method for driving the liquid crystal: a twisted nematic (TN) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view mode, and the like.

This embodiment can be implemented in combination with any of the other embodiments as appropriate.

Embodiment 5

A semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device of one embodiment of the present invention, cellular phones, game consoles (including portable game consoles), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 15A to 15E illustrate specific examples of these electronic devices.

Figure 15A:
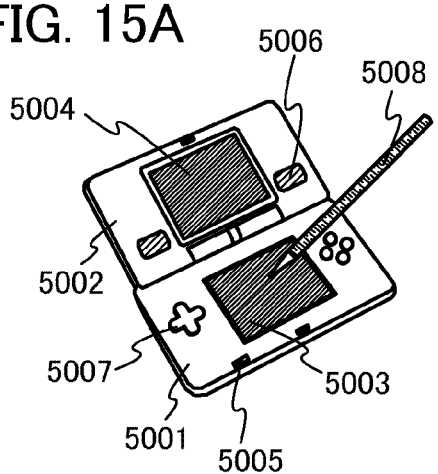
FIGS. 15A to 15E each illustrate an electronic device.

FIG. 15A illustrates a portable game console including a housing 5001, a housing 5002, a display portion 5003, a display portion 5004, a microphone 5005, a speaker 5006, an operation key 5007, a stylus 5008, and the like. A semiconductor device of one embodiment of the present invention can be used for the display portion 5003, the display portion 5004, or a circuit in another portion. Note that although the portable game console in FIG. 15A includes the two display portions 5003 and 5004, the number of display portions included in the portable game console is not limited to two.

Figure 15B:
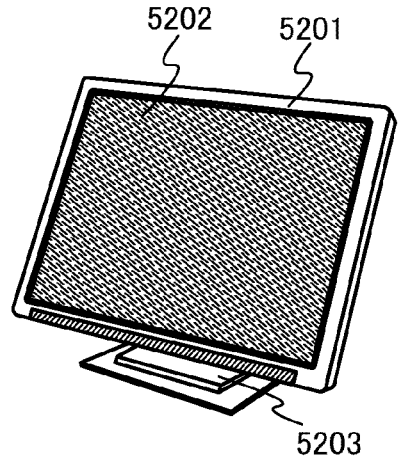

FIG. 15B illustrates a display device including a housing 5201, a display portion 5202, a support base 5203, and the like. A semiconductor device of one embodiment of the present invention can be used for the display portion 5202 or a circuit in another portion. Note that a display device includes, in its category, any display device for displaying information, such as display devices for personal computers, TV broadcast reception, and advertisement.

Figure 15C:
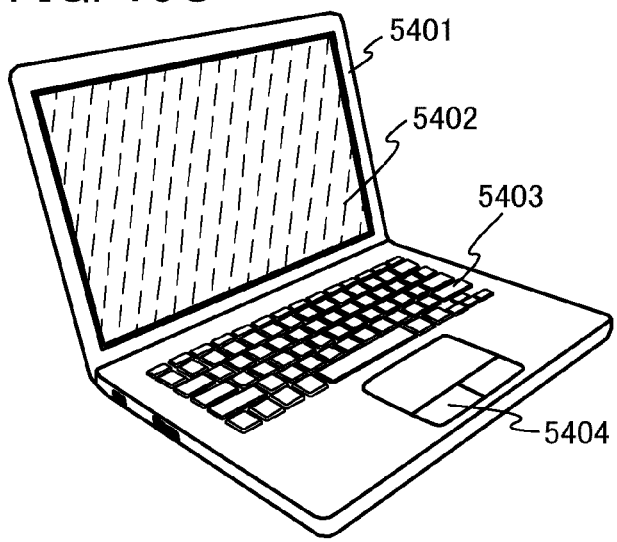

FIG. 15C illustrates a laptop including a housing 5401, a display portion 5402, a keyboard 5403, a pointing device 5404, and the like. A semiconductor device of one embodiment of the present invention can be used for the display portion 5402 or a circuit in another portion.

Figure 15D:
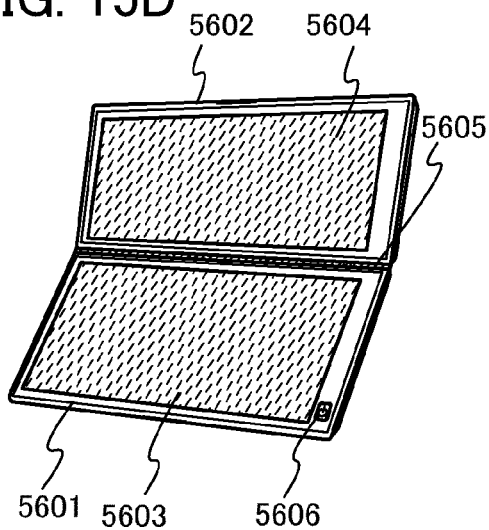

FIG. 15D illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A semiconductor device of one embodiment of the present invention can be used for the first display portion 5603, the second display portion 5604, or a circuit in another portion. A semiconductor device with a position input function may be used as at least one of the first display portion 5603 and the second display portion 5604. Note that the position input function can be added by providing a touch panel in a semiconductor device. Alternatively, the position input function can be added by providing a photoelectric conversion element called a photosensor in a pixel area of a semiconductor device.

Figure 15E:
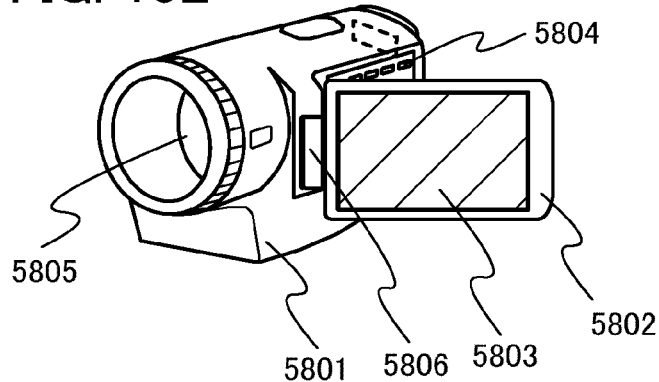

FIG. 15E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802. A semiconductor device of one embodiment of the present invention can be used for the display portion 5803 or a circuit in another portion.

This embodiment can be implemented in combination with any of the other embodiments as appropriate.

This application is based on Japanese Patent Application serial no. 2012-168450 filed with Japan Patent Office on Jul. 30, 2012, the entire contents of which are hereby incorporated by reference.

What is claimed is:
1. A semiconductor device comprising:
   a first sequential circuit and a second sequential circuit,
   wherein each of the first sequential circuit and the second sequential circuit comprises an input terminal and an output terminal,
   wherein the output terminal of the first sequential circuit is electrically connected to the input terminal of the second sequential circuit,
   wherein the first sequential circuit comprises:
      a first transistor comprising a gate, a first terminal, and a second terminal;
      a second transistor comprising a gate, a first terminal, and a second terminal;
      a third transistor comprising a gate, a first terminal, and a second terminal;
      a fourth transistor comprising a gate, a first terminal, and a second terminal;
      a fifth transistor comprising a gate, a first terminal, and a second terminal;
      a first switch;
      a second switch;

a first wiring electrically connected to the first terminal of the first transistor;

a second wiring electrically connected to the second terminal of the first transistor, the first terminal of the second transistor, the first terminal of the third transistor, the gate of the fourth transistor, and the output terminal of the first sequential circuit;

a third wiring electrically connected to the second terminal of the second transistor, the second terminal of the third transistor, the second terminal of the fourth transistor, and the second terminal of the fifth transistor; and a fourth wiring electrically connected to the gate of the second transistor and the first terminal of the fifth transistor through the first switch, and to the gate of the third transistor and the first terminal of the fourth transistor through the second switch, wherein the first terminal of the fourth transistor is electrically connected to the gate of the third transistor, wherein the gate of the fifth transistor is electrically connected to the input terminal of the first sequential circuit, and wherein the fourth wiring is configured to be supplied with a potential of VDD.

2. The semiconductor device according to claim 1, wherein a channel width of the third transistor is narrower than a channel width of the second transistor.

3. The semiconductor device according to claim 1, wherein a channel width of the fourth transistor is narrower than a channel width of the third transistor.

4. The semiconductor device according to claim 1, wherein a potential supplied to the first wiring is higher than a potential supplied to the third wiring.

5. The semiconductor device according to claim 1, wherein at least one of the first to fourth transistors comprises an oxide semiconductor in a channel formation region.

6. The semiconductor device according to claim 5, wherein the oxide semiconductor comprises In, Ga, and Zn.

7. A semiconductor device comprising:
a first sequential circuit and a second sequential circuit,
wherein each of the first sequential circuit and the second sequential circuit comprises an input terminal and an output terminal,
wherein the output terminal of the first sequential circuit is electrically connected to the input terminal of the second sequential circuit,
wherein the first sequential circuit comprises:
a first transistor comprising a gate, a first terminal, and a second terminal;
a second transistor comprising a gate, a first terminal, and a second terminal;
a third transistor comprising a gate, a first terminal, and a second terminal;
a fourth transistor comprising a gate, a first terminal, and a second terminal;
a fifth transistor comprising a gate, a first terminal, and a second terminal;
a sixth transistor comprising a gate, a first terminal, and a second terminal;
a seventh transistor comprising a gate, a first terminal, and a second terminal;
a first switch;
a second switch;
a first wiring electrically connected to the first terminal of the first transistor;
a second wiring electrically connected to the second terminal of the first transistor, the first terminal of the second transistor, the first terminal of the third transistor, the gate of the fourth transistor, and the output terminal of the first sequential circuit; and a third wiring electrically connected to the second terminal of the second transistor, the second terminal of the third transistor, the second terminal of the fourth transistor, the second terminal of the fifth transistor, the second terminal of the sixth transistor, and the second terminal of the seventh transistor; and a fourth wiring electrically connected to the gate of the second transistor, the first terminal of the fifth transistor, and the first terminal of the sixth transistor through the first switch, and the gate of the third transistor, the first terminal of the fourth transistor, and the first terminal of the seventh transistor through the second switch, wherein the first terminal of the fourth transistor is electrically connected to the gate of the third transistor, wherein the gate of the fifth transistor is electrically connected to the input terminal of the first sequential circuit, and wherein the fourth wiring is configured to be supplied with a potential of VDD.

8. The semiconductor device according to claim 7, wherein a channel width of the third transistor is narrower than a channel width of the second transistor.

9. The semiconductor device according to claim 7, wherein a channel width of the fourth transistor is narrower than a channel width of the third transistor.

10. The semiconductor device according to claim 7, wherein a potential supplied to the first wiring is higher than a potential supplied to the third wiring.

11. The semiconductor device according to claim 7, wherein at least one of the first to seventh transistors comprises an oxide semiconductor in a channel formation region.

12. The semiconductor device according to claim 11, wherein the oxide semiconductor comprises In, Ga, and Zn.

13. A semiconductor device comprising:
a first sequential circuit and a second sequential circuit,
wherein each of the first sequential circuit and the second sequential circuit comprises an input terminal and an output terminal,
wherein the output terminal of the first sequential circuit is electrically connected to the input terminal of the second sequential circuit,
wherein the first sequential circuit comprises:
a first transistor comprising a gate, a first terminal, and a second terminal;
a second transistor comprising a gate, a first terminal, and a second terminal;
a third transistor comprising a gate, a first terminal, and a second terminal;
a fourth transistor comprising a gate, a first terminal, and a second terminal;
a fifth transistor comprising a gate, a first terminal, and a second terminal;
a sixth transistor comprising a gate, a first terminal, and a second terminal;
a seventh transistor comprising a gate, a first terminal, and a second terminal;
an eighth transistor comprising a gate, a first terminal, and a second terminal;
a ninth transistor comprising a gate, a first terminal, and a second terminal;
a first wiring electrically connected to the first terminal of the first transistor;

a second wiring electrically connected to the second terminal of the first transistor, the first terminal of the second transistor, the first terminal of the third transistor, the gate of the fourth transistor, and the output terminal of the first sequential circuit;

a third wiring electrically connected to the second terminal of the second transistor, the second terminal of the third transistor, the second terminal of the fourth transistor, the second terminal of the fifth transistor, the second terminal of the sixth transistor, and the second terminal of the seventh transistor; and a fourth wiring electrically connected to the gate of the second transistor, the first terminal of the fifth transistor, and the first terminal of the sixth transistor through the eighth transistor, and the gate of the third transistor, the first terminal of the fourth transistor, and the first terminal of the seventh transistor through the ninth transistor, wherein the first terminal of the fourth transistor is electrically connected to the gate of the third transistor, wherein the first terminal of the fifth transistor is electrically connected to the gate of the second transistor, wherein the gate of the fifth transistor is electrically connected to the input terminal of the first sequential circuit, wherein the gate of the sixth transistor and the gate of the ninth transistor are electrically connected to each other, wherein the gate of the seventh transistor and the gate of the eighth transistor are electrically connected to each other, and wherein the fourth wiring is configured to be supplied with a potential of VDD.

14. The semiconductor device according to claim 13, wherein a channel width of the third transistor is narrower than a channel width of the second transistor.

15. The semiconductor device according to claim 13, wherein a channel width of the fourth transistor is narrower than a channel width of the third transistor.

16. The semiconductor device according to claim 13, wherein a potential supplied to the first wiring is higher than a potential supplied to the third wiring.

17. The semiconductor device according to claim 13, wherein at least one of the first to ninth transistors comprises an oxide semiconductor in a channel formation region.

18. The semiconductor device according to claim 17, wherein the oxide semiconductor comprises In, Ga, and Zn.

19. The semiconductor device according to claim 7,
wherein the gate of the sixth transistor and the second switch are electrically connected to each other so that a conduction state of the sixth transistor and a conduction state of the second switch are configured to be controlled with a first signal, and wherein the gate of the seventh transistor and the first switch are electrically connected to each other so that a conduction state of the seventh transistor and a conduction state of the first switch are configured to be controlled with a second signal that is different from the first signal.

* * * * *